(12) United States Patent
Hikosaka

(10) Patent No.: US 12,149,854 B2
(45) Date of Patent: Nov. 19, 2024

(54) PHOTOELECTRIC CONVERSION DEVICE

(71) Applicant: CANON KABUSHIKI KAISHA, Tokyo (JP)

(72) Inventor: Shingo Hikosaka, Kanagawa (JP)

(73) Assignee: CANON KABUSHIKI KAISHA, Tokyo (JP)

(*) Notice: Subject to any disclaimer, the term of this patent is extended or adjusted under 35 U.S.C. 154(b) by 107 days.

(21) Appl. No.: 18/069,011

(22) Filed: Dec. 20, 2022

(65) Prior Publication Data
US 2023/0224609 A1 Jul. 13, 2023

(30) Foreign Application Priority Data

Jan. 13, 2022 (JP) ................. 2022-003751

(51) Int. Cl.
H04N 25/773 (2023.01)
H04N 25/583 (2023.01)
H04N 25/79 (2023.01)

(52) U.S. Cl.
CPC ......... *H04N 25/773* (2023.01); *H04N 25/583* (2023.01); *H04N 25/79* (2023.01)

(58) Field of Classification Search
None
See application file for complete search history.

(56) References Cited

U.S. PATENT DOCUMENTS

| 10,567,712 | B2 | 2/2020 | Hikosaka | |
| 10,674,129 | B2 | 6/2020 | Kawano | |
| 11,146,761 | B2 | 10/2021 | Hikosaka | |
| 2020/0244909 | A1* | 7/2020 | Morimoto | H01L 31/107 |
| 2021/0044768 | A1* | 2/2021 | Kuroda | H04N 25/78 |
| 2022/0201182 | A1* | 6/2022 | Maekawa | H04N 25/773 |
| 2023/0388678 | A1* | 11/2023 | Omodani | H04N 25/767 |

FOREIGN PATENT DOCUMENTS

| JP | 2020-129759 A | 8/2020 | |
| JP | 2020-145502 A | 9/2020 | |
| JP | 2021-44636 A | 3/2021 | |
| WO | WO-2023243380 A1 * | 12/2023 | ........... H04N 25/773 |
| WO | WO-2023243381 A1 * | 12/2023 | ............. G01S 17/86 |
| WO | WO-2024074322 A1 * | 4/2024 | |

* cited by examiner

Primary Examiner — Paul M Berardesca
(74) Attorney, Agent, or Firm — VENABLE LLP

(57) ABSTRACT

The photoelectric conversion device includes a pixel including a photoelectric conversion unit that outputs a pulse in response to incidence of a photon and a pulse counting unit that counts the pulse. The pulse counting unit includes first and second counters, a selection circuit for selecting a signal input to the first and second counters, and a control unit. The control unit controls the selection circuit to perform a first connection mode in which a counter of a first number of bits is configured by the first and second counters, and a second connection mode in which a counter of a second number of bits smaller than the first number of bits is configured by at least one of the first and second counters. The second connection mode includes a third connection mode in which pulses are counted in parallel by the first and second counters.

20 Claims, 22 Drawing Sheets

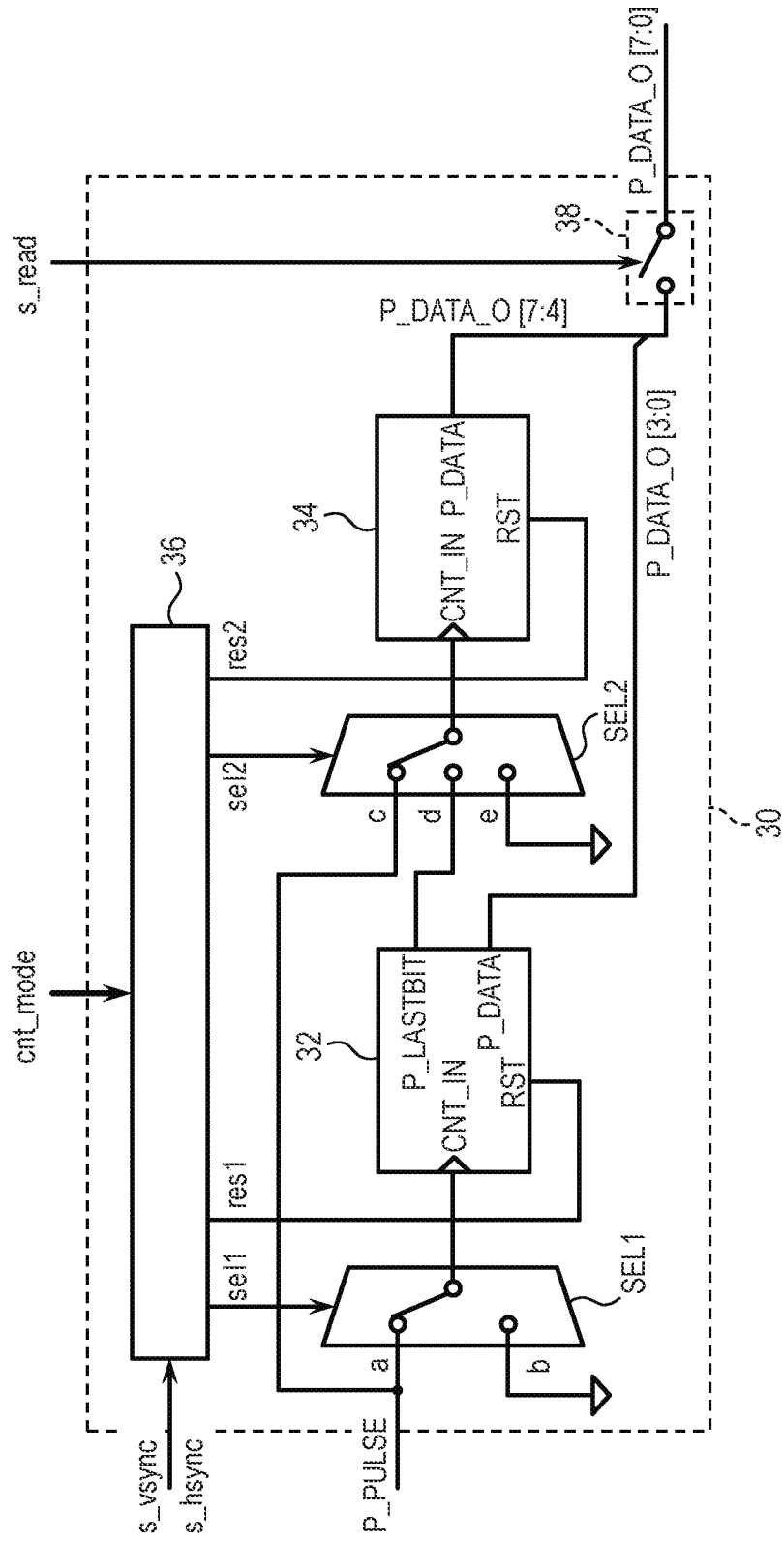

PHOTOELECTRIC CONVERSION DEVICE

BACKGROUND OF THE INVENTION

Field of the Invention

The present invention relates to a photoelectric conversion device.

Description of the Related Art

As a photoelectric conversion element, an APD (Avalanche Photo Diode) and a SPAD (Single Photon Avalanche Diode) in which charge generated by incidence of a photon is multiplied by avalanche breakdown is known. These photoelectric conversion elements are used in a photoelectric conversion device having a function of counting the number of detected photons. Japanese Patent Application Laid-Open No. 2021-044636 discloses a photoelectric conversion device that enables various signal processing including processing of data of a plurality of frames by providing a memory for holding data in each pixel. According to this method, various signals including signals obtained by processing data of a plurality of frames can be output from the pixel.

However, in the photoelectric conversion device of Japanese Patent Application Laid-Open No. 2021-044636, it is necessary to provide a memory for storing data of a single frame or a plurality of frames for each pixel, and an increase in the area of the pixel circuit cannot be avoided.

SUMMARY OF THE INVENTION

An object of the present invention is to provide a highly functional photoelectric conversion device capable of outputting data of a plurality of frames or a result of processing data of a single frame or a plurality of frames from a pixel while suppressing a circuit scale of the pixel.

According to an embodiment of the present disclosure, there is provided a photoelectric conversion device including a pixel including a photoelectric conversion unit configured to output a pulse in response to incidence of a photon, and a pulse counting unit configured to count pulses output from the photoelectric conversion unit, wherein the pulse counting unit includes a first counter, a second counter, a selection circuit configured to select a signal input to each of the first counter and the second counter, and a control unit configured to control the selection circuit, wherein the control unit is configured to control the selection circuit to perform a first connection mode in which a counter of a first number of bits is configured by the first counter and the second counter, and a second connection mode in which a counter of a second number of bits smaller than the first number of bits is configured by at least one of the first counter and the second counter, and wherein the second connection mode includes a third connection mode in which the pulses are counted in parallel by the first counter and the second counter.

Further features of the present invention will become apparent from the following description of exemplary embodiments with reference to the attached drawings.

BRIEF DESCRIPTION OF THE DRAWINGS

FIG. 4 is a block diagram illustrating a configuration example of a pulse counting unit in the photoelectric conversion device according to the first embodiment of the present invention.

DESCRIPTION OF THE EMBODIMENTS

Preferred embodiments of the present invention will now be described in detail in accordance with the accompanying drawings.

First Embodiment

Figure 1:
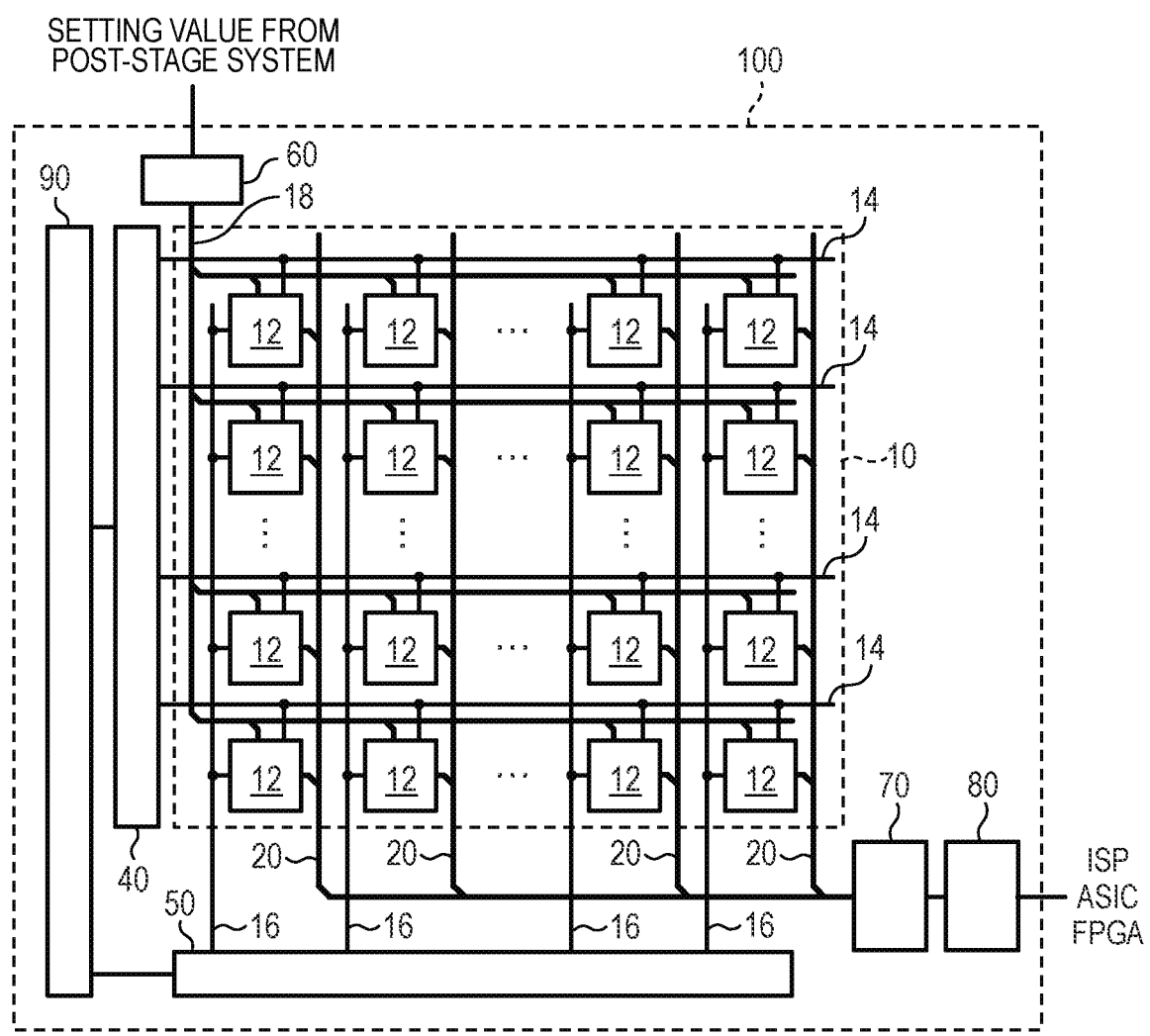
FIG. 1 is a block diagram illustrating a schematic configuration of a photoelectric conversion device according to a first embodiment of the present invention.
Figure 2:
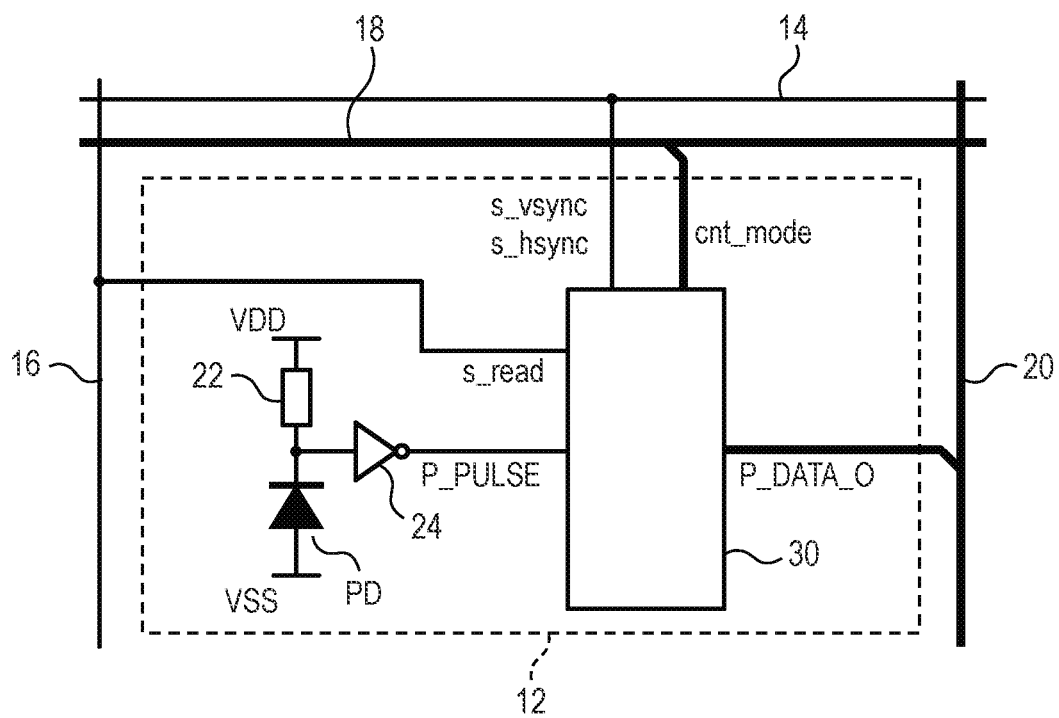
FIG. 2 is a block diagram illustrating a configuration example of a pixel in the photoelectric conversion device according to the first embodiment of the present invention.
Figure 3A:
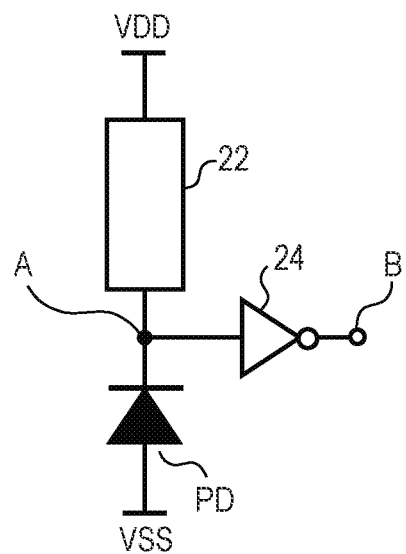
FIG. 3A, FIG. 3B, and FIG. 3C are diagrams illustrating a basic operation of a photoelectric conversion element in the photoelectric conversion device according to the first embodiment of the present invention.
Figure 3B:
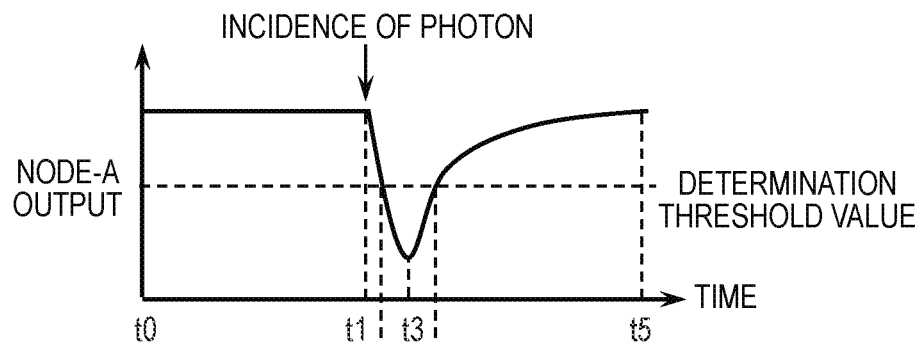
Figure 3C:
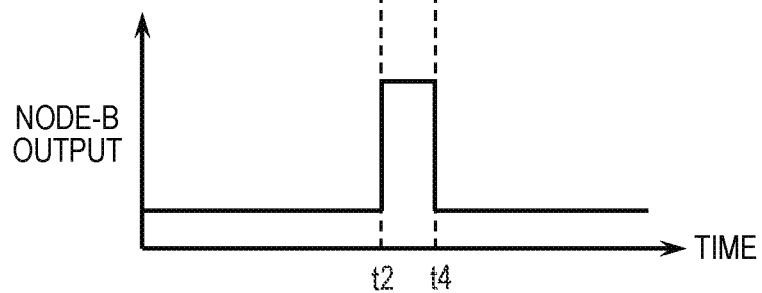
Figure 5A:
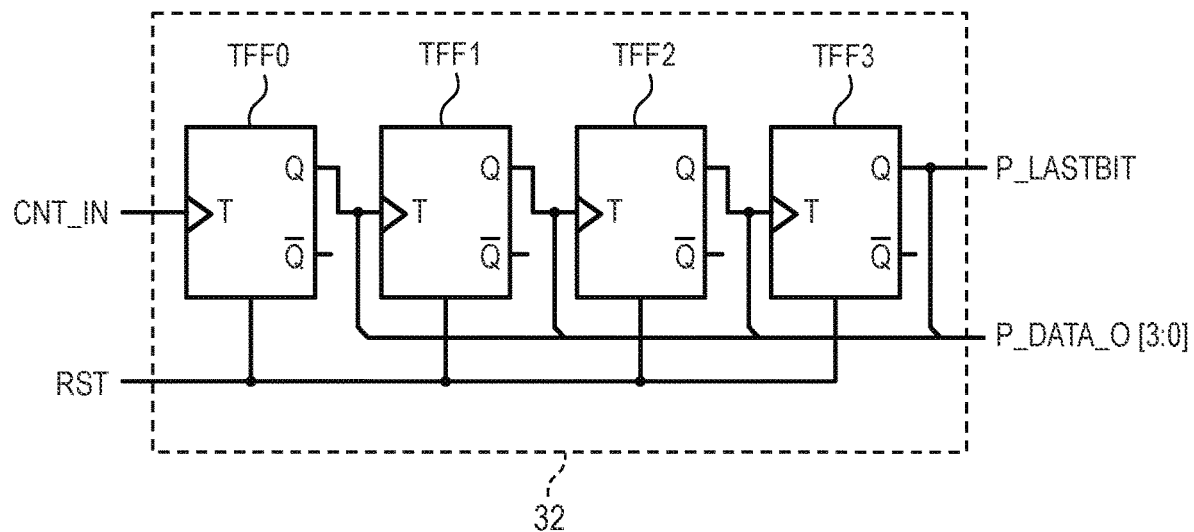
FIG. 5A and FIG. 5B are block diagrams illustrating a configuration example of a sub-counter in the photoelectric conversion device according to the first embodiment of the present invention.
Figure 5B:
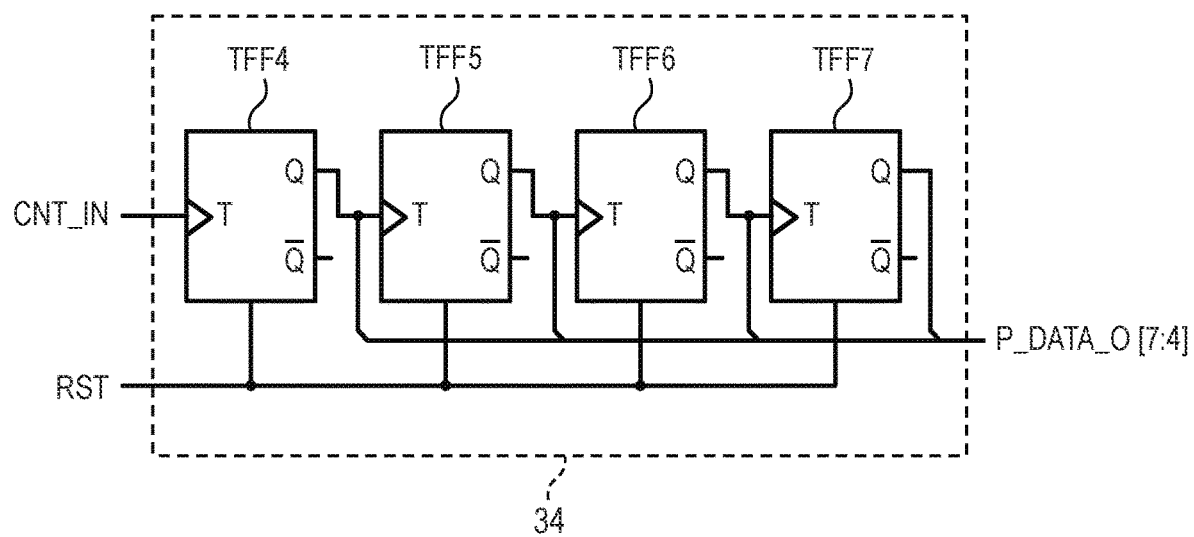
Figure 6:
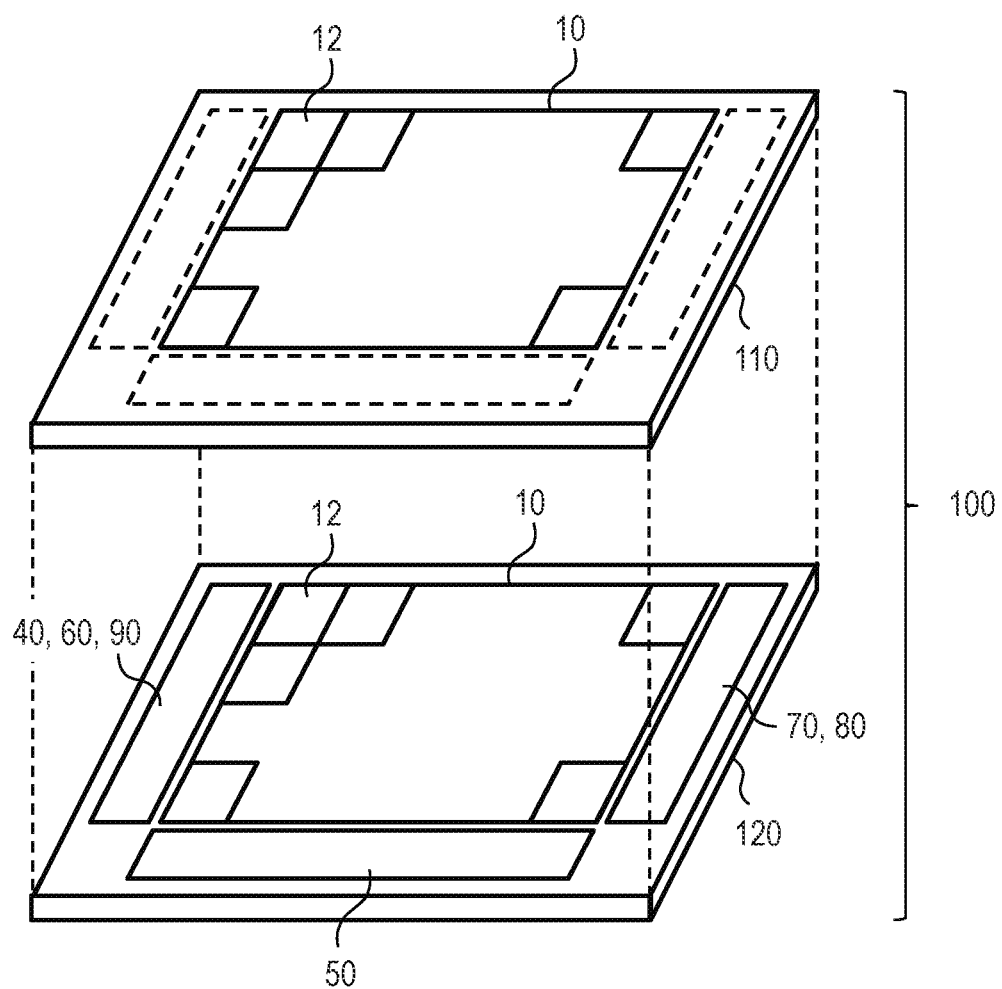
FIG. 6 is a perspective view illustrating a configuration example of the photoelectric conversion device according to the first embodiment of the present invention.

A schematic configuration of a photoelectric conversion device according to a first embodiment of the present invention will be described with reference to FIG. 1 to FIG. 6. FIG. 1 is a block diagram illustrating a schematic configuration of a photoelectric conversion device according to the present embodiment. FIG. 2 is a block diagram illustrating a configuration example of a pixel in the photoelectric conversion device according to the present embodiment. FIG. 3A to FIG. 3C are diagrams illustrating a basic operation of a photoelectric conversion element in the photoelectric conversion device according to the present embodiment. FIG. 4 is a block diagram illustrating a configuration example of a pulse counting unit in the photoelectric conversion device according to the present embodiment. FIG. 5A and FIG. 5B are block diagrams illustrating a configuration example of a sub-counter in the photoelectric conversion device according to the present embodiment. FIG. 6 is a perspective view illustrating a configuration example of the photoelectric conversion device according to the present embodiment.

As illustrated in FIG. 1, the photoelectric conversion device 100 according to the present embodiment includes a pixel region 10, a vertical selection circuit 40, a horizontal selection circuit 50, a register block 60, a signal processing circuit 70, an output circuit 80, and a drive control circuit 90.

The pixel region 10 is provided with a plurality of pixels 12 arranged in an array so as to form a plurality of rows and a plurality of columns. The number of pixels 12 constituting the pixel region 10 is not particularly limited. For example, the pixel region 10 may be constituted by a plurality of pixels 12 arranged in an array of several thousands of rows and several thousands of columns as in a general digital camera. Alternatively, the pixel region 10 may be composed of a plurality of pixels 12 arranged in one row or one column. Alternatively, one pixel 12 may constitute the pixel region 10.

In each row of the pixel array of the pixel region 10, a control line 14 is arranged extending in a first direction (lateral direction in FIG. 1). The control line 14 of each row is connected to the pixels 12 arranged in the first direction on the corresponding row, and serves as a signal line common to these pixels 12. The first direction in which the control lines 14 extend may be denoted as a row direction or a horizontal direction. Each of the control lines 14 may include a plurality of signal lines for supplying a plurality of types of control signals to the pixels 12. The control line 14 of each row is connected to the vertical selection circuit 40.

In addition, in each column of the pixel array of the pixel region 10, a control line 16 is arranged so as to extend in a second direction (vertical direction in FIG. 1) intersecting with the first direction. The control line 16 of each column is connected to the pixels 12 arranged in the second direction on the corresponding column, and serves as a signal line common to these pixels 12. The second direction in which the control lines 16 extend may be denoted as a column direction or a vertical direction. Each of the control lines 16 may include a plurality of signal lines for supplying a plurality of types of control signals to the pixels 12. The control line 16 of each column is connected to the horizontal selection circuit 50.

A setting signal line 18 is connected to each of the plurality of pixels 12 arranged in the pixel region 10. The setting signal line 18 may include a plurality of signal lines for supplying a plurality of kinds of signals to the pixels 12. The setting signal line 18 is connected to the register block 60. A pixel signal output line 20 is connected to each of the plurality of pixels 12 arranged in the pixel region 10. The pixel signal output line 20 may include a plurality of signal lines for transferring a digital signal of a plurality of bits output from the pixel 12 bit by bit. The pixel signal output line 20 may be configured by a plurality of signal lines arranged in each column of the pixel array of the pixel region 10, or may be configured by a plurality of signal lines arranged in each row of the pixel array of the pixel region 10. The pixel signal output line 20 is connected to the signal processing circuit 70.

The vertical selection circuit 40 is a control circuit having a function of receiving a control signal output from the drive control circuit 90, generating a control signal for driving the pixels 12, and supplying the control signal to the pixels 12 via the control line 14. A logic circuit such as a shift register or an address decoder may be used as the vertical selection circuit 40. The vertical selection circuit 40 sequentially supplies control signals to the pixels 12 of the pixel region 10 on the row basis, and sequentially drives the pixels 12 of the pixel region 10 on the row basis.

The horizontal selection circuit 50 is a control circuit having a function of receiving a control signal output from the drive control circuit 90, generating a control signal for driving the pixels 12, and supplying the control signal to the pixels 12 via the control line 16. A logic circuit such as a shift register or an address decoder may be used as the horizontal selection circuit 50. The horizontal selection circuit 50 sequentially scans the pixels 12 in the pixel region 10 on the column basis, and outputs the pixel signals held by the pixels 12 to the signal processing circuit 70 via the pixel signal output line 20.

The register block 60 receives data from systems disposed at a post-stage of the photoelectric conversion device 100, such as ISP (Image Signal Processor), ASIC (Application Specific Integrated Circuit), and FPGA (Field Programmable Gate Array). The register block 60 has a role of holding the received data as setting values of various operations of the photoelectric conversion device 100. The data communication means between the post-stage system and the register block 60 is not particularly limited, and for example, serial communication means such as I2C (Inter-Integrated Circuit) or SPI (Serial Peripheral Interface) may be applied. The register block 60 stores various settings such as timing setting of the operation of the photoelectric conversion device 100, pixel driving conditions, and setting of drive capability in the analog driving portion, and distributes them to each circuit via the setting signal line 18. In FIG. 1, for simplicity, only the setting signal line 18 connecting the register block 60 and the pixel 12 is illustrated.

The signal processing circuit 70 is a processing circuit that performs digital arithmetic processing such as offset processing and digital gain processing on the pixel signal input via the pixel signal output line 20. The digital arithmetic processing performed by the signal processing circuit 70 is not particularly limited, and various other digital arithmetic processing may be applied.

The output circuit 80 is a circuit including a serializer that converts parallel data into serial data and an external interface circuit, and transmitting a pixel signal after digital arithmetic processing in the signal processing circuit 70 to the post-stage system such as ISP, ASIC, or FPGA. As the external interface circuit, for example, SerDes (SERializer/DESerializer) transmission circuits such as LVDS (Low Voltage Differential Signaling) circuit and SLVS (Scalable Low Voltage Signaling) circuit may be applied. Note that the configuration of the output circuit 80 is not limited thereto, and may be another configuration such as a parallel output.

The drive control circuit 90 is a control circuit for generating control signals for controlling the operation and timing of the vertical selection circuit 40, the horizontal selection circuit 50, and the like, and supplying the control signals to each circuit block. Although not illustrated in FIG. 1 for simplicity, the drive control circuit 90 also has a function of controlling the overall operation of the photoelectric conversion device 100 by supplying control signals for controlling other circuit blocks other than the vertical selection circuit 40 at the same time. The drive control circuit 90 may be driven by a clock signal input from the outside, or may be driven by a clock signal such as a PLL circuit provided in the photoelectric conversion device 100.

As illustrated in FIG. 2, each pixel 12 includes a photoelectric conversion element PD, a quenching element 22, a waveform shaping unit 24, and a pulse counting unit 30.

The photoelectric conversion element PD may be an avalanche photodiode (hereinafter referred to as "APD"). An anode of the APD constituting the photoelectric conversion element PD is connected to a node to which a voltage VSS is supplied. A cathode of the APD constituting the photoelectric conversion element PD is connected to one terminal of the quenching element 22. The other terminal of the quenching element 22 is connected to a node to which a voltage VDD higher than the voltage VSS is supplied. The voltage VSS and the voltage VDD are set such that a reverse bias voltage sufficient for the APD to perform the avalanche multiplication operation is applied. In one example, a negative high voltage is applied as the voltage VSS, and a positive voltage about a power supply voltage is applied as the voltage VDD. For example, the voltage VSS is −30 V and the voltage VDD is 1 V.

The photoelectric conversion element PD may be formed of an APD as described above. By supplying a reverse bias voltage sufficient to perform the avalanche multiplication operation to the APD, charge generated by light incidence to the APD cause avalanche multiplication, and an avalanche current is generated. Operation modes in a state where a reverse bias voltage is supplied to the APD include a Geiger mode and a linear mode. The Geiger mode is an operation mode in which the voltage applied between the anode and the cathode is set to a reverse bias voltage larger than a breakdown voltage of the APD. The linear mode is an operation mode in which the voltage applied between the anode and the cathode is set to a reverse bias voltage close to or lower than the breakdown voltage of the APD. The APD operating in the Geiger mode is called SPAD (Single Photon Avalanche Diode). The APD constituting the photoelectric conversion element PD may operate in the linear mode or the Geiger mode.

The quenching element 22 has a function of converting a change in the avalanche current generated in the photoelectric conversion element PD into a voltage signal. Further, the quenching element 22 functions as a load circuit (quenching circuit) at the time of signal multiplication by avalanche multiplication, and has a function of reducing a voltage applied to the photoelectric conversion element PD to suppress avalanche multiplication. The operation in which the quenching element 22 suppresses avalanche multiplication is called a quenching operation. Further, the quenching element 22 has a function of returning the voltage supplied to the photoelectric conversion element PD to the voltage VDD by flowing a current corresponding to the voltage drop by the quenching operation. The operation in which quenching element 22 returns the voltage supplied to the photoelectric conversion element PD to the voltage VDD is called a recharging operation. The quenching element 22 may comprise one or more MOS transistors or resistor elements such as diffusion resistors.

The waveform shaping unit 24 includes an input node connected to a connection node between the photoelectric conversion element PD and the quenching element 22, and an output node. The waveform shaping unit 24 has a function of converting an analog signal supplied from the photoelectric conversion element PD into a pulse signal (signal P_PULSE). The waveform shaping unit 24 may be configured by a logic circuit including a NOT circuit (inverter circuit), a NOR circuit, a NAND circuit, and the like. The output node of the waveform shaping unit 24 is connected to the pulse counting unit 30.

The pulse counting unit 30 is supplied with a signal P_PULSE from the waveform shaping unit 24, and an operation mode setting signal cnt_mode from the register block 60 via the setting signal line 18. Further, The pulse counting unit 30 is supplied with control signals such as a vertical synchronization signal s_vsync and a horizontal synchronization signal s_hsync from the vertical selection circuit 40 via the control line 14, and the control signal s_read from the horizontal selection circuit 50 via the control line 16. The pulse counting unit 30 outputs a signal P_DATA_O according to these signals.

FIG. 3A to FIG. 3C are diagrams illustrating the basic operation of the photoelectric conversion unit including the photoelectric conversion element PD, the quenching element 22, and the waveform shaping unit 24. FIG. 3A illustrates a circuit diagram of the photoelectric conversion unit, FIG. 3B illustrates a waveform of a signal at an input node (node A) of the waveform shaping unit 24, and FIG. 3C illustrates a waveform of a signal at an output node (node B) of the waveform shaping unit 24. Here, for simplicity of explanation, it is assumed that the waveform shaping unit 24 is configured by an inverter circuit.

At time t0, a reverse bias voltage of a potential difference corresponding to (VDD−VSS) is applied to the photoelectric conversion element PD. Although the reverse bias voltage sufficient to cause avalanche multiplication is applied between the anode and the cathode of the APD constituting the photoelectric conversion element PD, there is no carrier that becomes a seed of avalanche multiplication in a state where no photons are incident on the photoelectric conversion element PD. Therefore, no avalanche multiplication occurs in the photoelectric conversion element PD, and no current flows through the photoelectric conversion element PD.

At time t1, it is assumed that a photon enters the photoelectric conversion element PD. When the photon is incident on the photoelectric conversion element PD, an electron-hole pair is generated by photoelectric conversion, avalanche multiplication occurs using these carriers as a seed, and an avalanche multiplication current flows through the photoelectric conversion element PD. When the avalanche multiplication current flows through the quenching element 22, a voltage drop by the quenching element 22 occurs, and the voltage of the node A begins to drop. When the voltage drop amount of the node A increases and the avalanche multiplication stops at time t3, the voltage level of the node A does not drop any further.

When the avalanche multiplication in the photoelectric conversion element PD stops, a current that compensates the voltage drop flows from the node to which the voltage VSS is supplied to the node A through the photoelectric conversion element PD, and the voltage of the node A gradually increases. Then, at time t5, node A is settled to the original voltage level.

The waveform shaping unit 24 binarizes the signal input from the node A according to a predetermined determination threshold value, and outputs the binarized signal from the node B. Specifically, the waveform shaping unit 24 outputs a Low-level signal from the node B when the voltage level of the node A exceeds the determination threshold value, and outputs a High-level signal from the node B when the voltage level of the node A is equal to or lower than the determination threshold value. For example, as illustrated in FIG. 3B, it is assumed that the voltage of the node A is equal to or lower than the determination threshold value during a period from time t2 to time t4. In this case, as illustrated in FIG. 3C, the signal level at the node B becomes Low-level during the period from time t0 to time t2 and during the period from time t4 to time t5, and becomes High-level during the period from time t2 to time t4.

Thus, the analog signal input from the node A is shaped into a digital signal by the waveform shaping unit 24. A pulse signal output from the waveform shaping unit 24 in response to incidence of a photon on the photoelectric conversion element PD is a photon detection pulse signal.

As illustrated in FIG. 4, the pulse counting unit 30 includes selection circuits SEL1 and SEL2, sub-counters 32 and 34, a connection mode switching circuit 36, and an output switch 38.

The connection mode switching circuit 36 is a control unit that controls the selection circuits SEL1 and SEL2 and the sub-counters 32 and 34. The connection mode switching circuit 36 dynamically generates selection signals sel1 and sel2 and counter reset signals res1 and res2 in accordance with the operation mode setting signal cnt_mode, the vertical synchronization signal s_vsync, and the horizontal synchronization signal s_hsync.

The selection circuit SEL1 includes two input nodes (a node a and a node b) and one output node. The selection signal sel1 is input from the connection mode switching circuit 36 to a control node of the selection circuit SEL1. The signal P_PULSE is input to the node a. A reference signal (Low-level) is input to the node b. The output node of the selection circuit SEL1 is connected to an input node CNT_IN of the sub-counter 32. The selection circuit SEL1 selects either the signal P_PULSE or the reference signal according to the selection signal sel1, and inputs the selected signal to the input node CNT_IN of the sub-counter 32.

The sub-counter 32 has two input nodes (an input node CNT_IN and an input node RST) and two output nodes (an output node P_LASTBIT and an output node P_DATA). The input node CNT_IN is connected to the output node of the selection circuit SEL1. The counter reset signal res1 is input to the input node RST from the connection mode switching circuit 36. The output node P_LATBIT is connected to a node d of the selection circuit SEL2. The output node P_DATA is connected to the output switch 38. The sub-counter 32 receives the output signal of the selection circuit SEL1 and the counter reset signal res1, and outputs a signal P_DATA_O [3:0] and a signal P_LASTBIT.

As illustrated in FIG. 5A, the sub-counter 32 may include four T-type flip-flops TFF0, TFF1, TFF2, and TFF3 connected in series. The input node CNT_IN of the sub-counter 32 is connected to an input node of the T-type flip-flop TFF0 of the first stage. The input node RST of the sub-counter 32 is connected to a reset node of each of the T-type flip-flops TFF0, TFF1, TFF2, and TFF3. The signal P_DATA [3:0] is a 4-bit digital signal having an output Q of the T-type flip-flop TFF0 as the least significant bit and an output Q of the T-type flip-flop TFF3 as the most significant bit. The signal P_LASTBIT is a 1-bit digital signal corresponding to the output Q of the T-type flip-flop TFF3.

The selection circuit SEL2 includes three input nodes (a node c, a node d, and a node e) and one output node. The selection signal sel2 is input from the connection mode switching circuit 36 to a control node of the selection circuit SEL2. The signal P_PULSE is input to the node c. The signal P_LASTBIT is input to the node d. The reference signal (Low-level) is input to the node e. The output node of the selection circuit SEL2 is connected to an input node CNT_IN of the sub-counter 34. The selection circuit SEL2 selects any one of the signal P_PULSE, the signal P_LASTBIT, and the reference signal according to the selection signal sel2, and inputs the selected signal to the input node CNT_IN of the sub-counter 34.

The sub-counter 34 includes two input nodes (an input node CNT_IN and an input node RST) and one output node (an output node P_DATA). The input node CNT_IN is connected to the output node of the selection circuit SEL2. The counter reset signal res2 is input to the input node RST from the connection mode switching circuit 36. The output node P_DATA is connected to the output switch 38. The sub-counter 34 receives the output signal of the selection circuit SEL2 and the counter reset signal res2, and outputs a signal P_DATA_O [7:4].

As illustrated in FIG. 5B, the sub-counter 34 may include four T-type flip-flops TFF4, TFF5, TFF6, and TFF7 connected in series. The input node CNT_IN of the sub-counter 34 is connected to an input node of the T-type flip-flop TFF4 of the first stage. The input node RST of the sub-counter 34 is connected to a reset node of each of the T-type flip-flops TFF4, TFF5, TFF6, and TFF7. The signal P_DATA [7:4] is a 4-bit digital signal having an output Q of the T-type flip-flop TFF4 as the least significant bit and an output Q of the T-type flip-flop TFF7 as the most significant bit.

The output switch 38 is a switch for controlling the output of a signal P_DATA_O [7:0] whose lower 4 bits are the signal P_DATA_O [3:0] output from the sub-counter 32 and whose upper 4 bits are the signal P_DATA_O [7:4] output from the sub-counter 34. The output switch 38 switches the connection state according to the level of the control signal s_read supplied from the horizontal selection circuit 50. For example, the output switch 38 is turned on (connected state) when the control signal s_read is High-level, and turned off (non-connected state) when the control signal s_read is Low-level.

In the present embodiment, the sub-counters 32 and 34 are configured by T-type flip-flops, but the configuration of the sub-counters 32 and 34 is not limited thereto as long as similar functions may be satisfied. Although the number of bits of the sub-counters 32 and 34 is four in the present embodiment, the number of bits of the sub-counters 32 and 34 is not limited thereto, and may be, for example, two bits or eight bits.

In the present embodiment, the output data of the sub-counter 32 is assigned to the lower 4 bits and the output data of the sub-counter 34 is assigned to the upper 4 bits to generate the signal P_DATA_O [7:0], but the configuration of the signal P_DATA_O [7:0] is not limited thereto. For example, the signal P_DATA_O [7:0] may be generated by assigning the output data of the sub-counter 32 to the upper 4 bits and the output data of the sub-counter 34 to the lower 4 bits.

The photoelectric conversion device 100 according to the present embodiment may be formed on one substrate, or may be formed as a stacked-type photoelectric conversion device in which a plurality of substrates is stacked. In the latter case, for example, as illustrated in FIG. 6, a sensor substrate 110 and a circuit substrate 120 may be stacked and electrically connected to each other to form a stacked-type photoelectric conversion device. At least the photoelectric conversion element PD among the constituent elements of the pixel 12 may be disposed on the sensor substrate 110. Further, among the components of the pixel 12, the quenching element 22, the waveform shaping unit 24, and the pulse counting unit 30 may be disposed on the circuit substrate 120. The photoelectric conversion element PD, the quenching element 22, the waveform shaping unit 24, and the pulse counting unit 30 are electrically connected to each other via an interconnection provided for each pixel 12. The circuit substrate 120 may further include the vertical selection circuit 40, the horizontal selection circuit 50, the register block 60, the signal processing circuit 70, the output circuit 80, and the drive control circuit 90.

The photoelectric conversion element PD and, the quenching element 22, the waveform shaping unit 24 and the pulse counting unit 30 of each pixel 12 may be provided on the sensor substrate 110 and the circuit substrate 120 so as to overlap each other in a plan view. The vertical selection circuit 40, the horizontal selection circuit 50, the register block 60, the signal processing circuit 70, the output circuit 80, and the drive control circuit 90 may be arranged around the pixel region 10 formed by the plurality of pixels 12. Here, the "plan view" refers to a view from a direction perpendicular to the surface of the sensor substrate 110.

By configuring the stacked-type photoelectric conversion device 100, the degree of integration of elements may be increased and high functionality may be achieved. In particular, by disposing the photoelectric conversion element PD, the quenching element 22, the waveform shaping unit 24, and the pulse counting unit 30 on different substrates, the photoelectric conversion elements PD may be disposed at high density without sacrificing the light receiving area of the photoelectric conversion element PD, and the photon detection efficiency may be improved.

The number of substrates constituting the photoelectric conversion device 100 is not limited to two, and three or more substrates may be stacked to form the photoelectric conversion device 100.

Although FIG. 6 assumes a chip diced as the sensor substrate 110 and the circuit substrate 120, the sensor substrate 110 and the circuit substrate 120 are not limited to the chip. For example, each of the sensor substrate 110 and the circuit substrate 120 may be a wafer. In addition, the sensor substrate 110 and the circuit substrate 120 may be stacked in a wafer state and then diced, or may be stacked and bonded after the sensor substrate 110 and the circuit substrate 120 are formed into chips.

According to the above configuration of the photoelectric conversion device of the present embodiment, various counting results may be obtained by switching the connection mode of the counter. Hereinafter, the connection mode of the counter which may be realized by the circuit configuration of the present embodiment will be described by taking first to fourth counter connection modes as an example.

First, the first counter connection mode will be described. In the first counter connection mode, the selection signal sel1 is set to the node a and the selection signal sel2 is set to the node d, whereby the two 4-bit sub-counters 32 and 34 are connected in series to operate as a normal 8-bit counter. This connection mode is an operation mode in which pulse counting for eight bits may be performed, and is effective, for example, in a high illuminance scene requiring a high dynamic range.

Next, the second counter connection mode will be described. In the second counter connection mode, the selection signal sel1 is set to the node a and the selection signal sel2 is set to the node e, whereby the input node of the sub-counter 32 is connected to the waveform shaping unit 24 and the input node of the sub-counter 34 is connected to Low-level. In this connection mode, the sub-counter 32 counts the output pulse of the waveform shaping unit 24, and the sub-counter 34 holds a count value up to that time. That is, the lower 4-bit signal P_DATA_O [3:0] output from the sub-counter 32 indicates a count value after the selection signals sel1 and sel2 are changed. The signal P_DATA_O [7:4] of the upper 4 bits output from the sub-counter 34 indicates a count value before the selection signals sel1 and sel2 are changed.

Next, the third counter connection mode will be described. In the third counter connection mode, the selection signal sel1 is set to the node b and the selection signal sel2 is set to the node c, whereby the input node of the sub-counter 34 is connected to the waveform shaping unit 24 and the input node of the sub-counter 32 is connected to the Low-level. In this connection mode, the sub-counter 34 counts the output pulse of the waveform shaping unit 24, and the sub-counter 32 holds a count value up to that time. That is, the upper 4-bit signal P_DATA_O [7:4] output from the sub-counter 34 indicates a count value after the selection signals sel1 and sel2 are changed. The lower 4-bit signal P_DATA_O [3:0] output from the sub-counter 32 indicates a count value before the selection signals sel1 and sel2 are changed.

Next, the fourth counter connection mode will be described. In the fourth counter connection mode, the selection signal sel1 is set to the node a and the selection signal sel2 is set to the node c, whereby both the inputs of the sub-counters 32 and 34 are connected to the waveform shaping unit 24. In this connection mode, the sub-counters 32 and 34 count the output pulses of the waveform shaping unit 24 in parallel. The lower 4-bit signal P_DATA_O [3:0] output from the sub-counter 32 and the upper 4-bit signal P_DATA_O [7:4] output from the sub-counter 34 output the same count value.

The first to fourth counter connection modes may realize various effects by dynamically switching the modes. Hereinafter, the operation modes of the photoelectric conversion device 100 using the dynamic switching of the counter connection mode will be described by taking first to third operation modes as examples.

Figure 7:
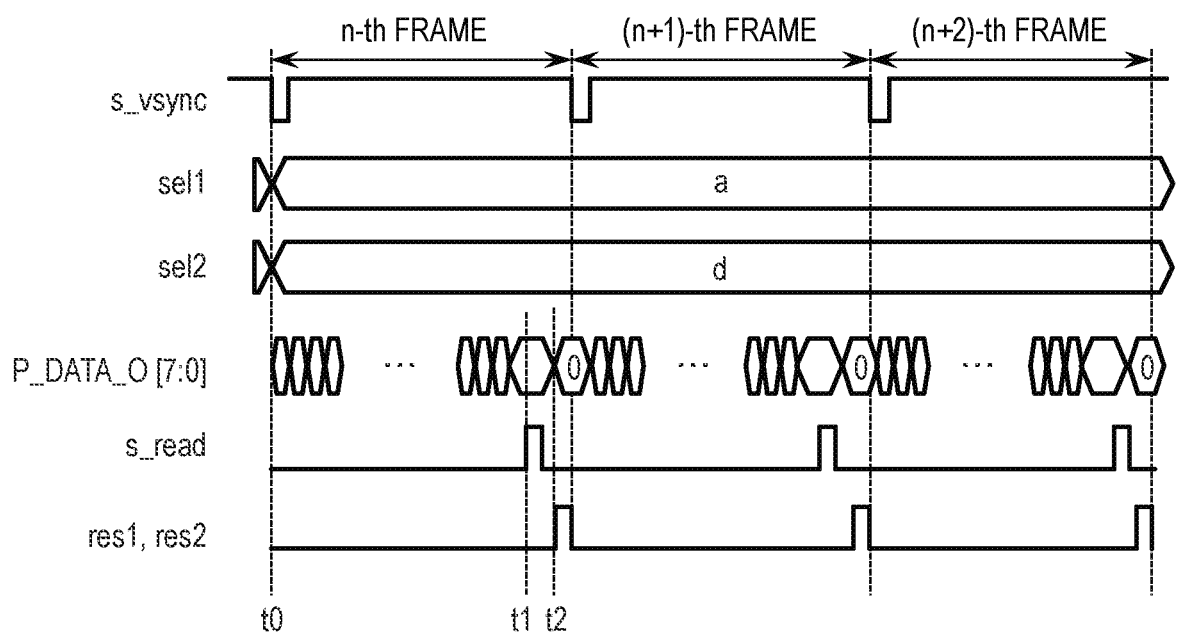
FIG. 7, FIG. 8, and FIG. 11 are timing charts illustrating a driving example of the photoelectric conversion device according to the first embodiment of the present invention.

First, a first operation mode of the photoelectric conversion device according to the present embodiment will be described with reference to FIG. 7. FIG. 7 is a timing chart illustrating a first operation mode of the photoelectric conversion device according to the present embodiment. The first operation mode is intended to operate similarly to general photon counting. FIG. 7 illustrates waveforms of the vertical synchronization signal s_vsync, the control signal s_read, and the counter reset signals res1 and res2, values of the selection signals sel1 and sel2, and values of the signal P_DATA_O [7:0]. The vertical synchronization signal s_vsync is an internal synchronization signal synchronized with the operation of one frame. Here, it is assumed that the timing at which the vertical synchronization signal s_vsync transits from High-level to Low-level is the end timing of the previous frame, and indicates the start timing of the next frame.

At time t0, the vertical synchronization signal s_vsync transitions from High-level to Low-level, and the operation of the n-th frame is started. The connection mode switching circuit 36 of the pulse counting unit 30 sets the selection signals sel1 and sel2 to the nodes a and d, respectively, according to the vertical synchronization signal s_vsync and the operation mode setting signal cnt_mode indicating the first operation mode (first counter connection mode). Thereby, the sub-counters 32 and 34 are connected in series, and operate as one 8-bit counter.

A period from time t0 to time t1 is an exposure period (pulse count period) of the photoelectric conversion element PD in the n-th frame. During the exposure period, the waveform shaping unit 24 outputs a photon detection pulse signal (signal P_PULSE) corresponding to the incidence of photons on the photoelectric conversion element PD. The sub-counters 32 and 34 count the number of pulses superimposed on the signal P_PULSE.

At time t1, the control signal s_read supplied from the horizontal selection circuit 50 to the output switch 38 of the pulse counting unit 30 via the control line 16 transitions from Low-level to High-level. Accordingly, the output switch 38 is turned on, and the signal P_DATA_O [7:0] indicating an 8-bit count value in which the output of the sub-counter 32 is set to the lower 4 bits and the output of the sub-counter 34 is set to the upper 4 bits is output to the pixel signal output line 20.

At time t2 after the signal P_DATA_O [7:0] is output to the signal processing circuit 70, the counter reset signals rest and res2 supplied from the connection mode switching circuit 36 to the sub-counters 32 and 34 transition from Low-level to High-level. As a result, the count values of the sub-counters 32 and 34 are reset, and the value of the signal P_DATA_O [7:0] becomes 0.

Thereafter, the vertical synchronization signal s_vsync transits from High-level to Low-level, the operation of the n-th frame ends, and the operation of the (n+1)-th frame starts. Thereafter, the same processing is repeated until the operation mode of the photoelectric conversion device 100 is switched.

Figure 8:
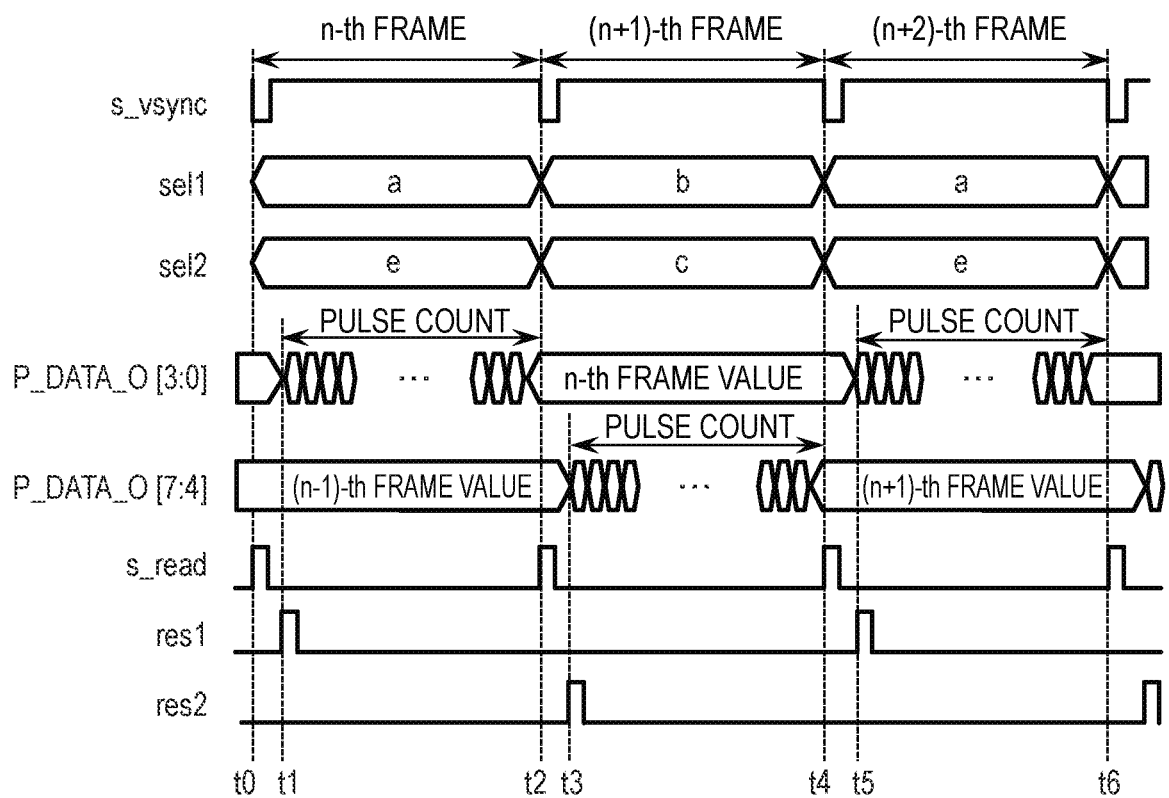

Next, a second operation mode of the photoelectric conversion device according to the present embodiment will be described with reference to FIG. 8. FIG. 8 is a timing chart illustrating a second operation mode of the photoelectric conversion device according to the present embodiment. FIG. 8 illustrates waveforms of the vertical synchronization signal s_vsync, the control signal s_read, and the counter reset signals res1 and res2, values of the selection signals sel1 and sel2, and values of the signals P_DATA_O [3:0] and P_DATA_O [7:4]. The vertical synchronization signal s_vsync is an internal synchronization signal synchronized with the operation of one frame.

At time t0, the vertical synchronization signal s_vsync transitions from High-level to Low-level, and the operation of the n-th frame is started. The connection mode switching circuit 36 of the pulse counting unit 30 sets the selection signals sel1 and sel2 to the nodes a and e, respectively, according to the vertical synchronization signal s_vsync and the operation mode setting signal cnt_mode indicating the second operation mode (second counter connection mode). Thus, the sub-counter 32 operates as a 4-bit counter for counting the number of pulses superimposed on the signal P_PULSE, and the sub-counter 34 holds the value of the (n−1)-th frame until the counter reset signal res2 becomes High-level next.

At the subsequent time t1, the counter reset signal res1 supplied from the connection mode switching circuit 36 to the sub-counter 32 transitions from Low-level to High-level. Thereby, the count value of the sub-counter 32 is reset, and the value of the signal P_DATA_O [3:0] becomes 0. The period from the time t1 to the time t2 at which the control signal s_read becomes High-level next corresponds to the exposure period (pulse count period) of the photoelectric conversion element PD in the n-th frame. At this time, the counter reset signal res2 remains at Low-level, and the value of the signal P_DATA_O [7:4] remains at the value of the (n−1)-th frame.

At the subsequent time t2, the control signal s_read supplied from the horizontal selection circuit 50 to the output switch 38 of the pulse counting unit 30 via the control line 16 transitions from Low-level to High-level. As a result, the output switch 38 is turned on, and the signal P_DATA_O [7:0] in which the output of the sub-counter 32 is set to the lower 4 bits and the output of the sub-counter 34 is set to the upper 4 bits is output to the pixel signal output line 20. In this signal P_DATA_O [7:0], the value of the lower 4 bits is composed of the count value of the n-th frame, and the value of the upper 4 bits is composed of the count value of the (n−1)-th frame. In other words, two frames of data may be simultaneously obtained.

Also at time t2, the vertical synchronization signal s_vsync transitions from High-level to Low-level, and the operation of the (n+1)-th frame is started. The connection mode switching circuit 36 of the pulse counting unit 30 sets the selection signals sel1 and sel2 to the nodes b and c, respectively, according to the vertical synchronization signal s_vsync and the operation mode setting signal cnt_mode indicating the second operation mode (third counter connection mode). Thus, the sub-counter 34 operates as a 4-bit counter for counting the number of pulses superimposed on the signal P_PULSE, and the sub-counter 32 holds the value of the n-th frame until the counter reset signal res1 becomes High-level next.

At the subsequent time t3, the counter reset signal res2 supplied from the connection mode switching circuit 36 to the sub-counter 34 transitions from Low-level to High-level. Thereby, the count value of the sub-counter 34 is reset, and the value of the signal P_DATA_O [7:4] becomes 0. The period from time t3 to time t4 at which the control signal s_read becomes High-level next corresponds to the exposure period (pulse count period) of the photoelectric conversion element PD in the (n+1)-th frame. At this time, the counter reset signal res1 remains at Low-level, and the value of the signal P_DATA_O [3:0] remains at the value of the n-th frame.

At the subsequent time t4, the control signal s_read supplied from the horizontal selection circuit 50 to the output switch 38 of the pulse counting unit 30 via the control line 16 transitions from Low-level to High-level. As a result, the output switch 38 is turned on, and a signal P_DATA_O [7:0] in which the output of the sub-counter 32 is set to the lower 4 bits and the output of the sub-counter 34 is set to the upper 4 bits is output to the pixel signal output line 20. In this signal P_DATA_O [7:0], the value of the lower 4 bits is composed of the count value of the n-th frame, and the value of the upper 4 bits is composed of the count value of the (n+1)-th frame. In other words, two frames of data may be simultaneously obtained.

Also at time t4, the vertical synchronization signal s_vsync transitions from High-level to Low-level, and the operation of the (n+2)-th frame is started. The connection mode switching circuit 36 of the pulse counting unit 30 sets the selection signals sel1 and sel2 to the nodes a and e, respectively, according to the vertical synchronization signal s_vsync and the operation mode setting signal cnt_mode indicating the second operation mode (second counter connection mode). Thus, the sub-counter 32 operates as a 4-bit counter for counting the number of pulses superimposed on the signal P_PULSE, and the sub-counter 34 holds the value of the (n+1)-th frame until the counter reset signal res1 becomes High-level next.

At the subsequent time t5, the counter reset signal res1 supplied from the connection mode switching circuit 36 to the sub-counter 32 transitions from Low-level to High-level. Thereby, the count value of the sub-counter 32 is reset, and the value of the signal P_DATA_O [3:0] becomes 0. The period from the time t5 to the time t6 at which the control signal s_read becomes High-level next corresponds to the exposure period (pulse count period) of the photoelectric conversion element PD in the (n+2)-th frame. At this time, the counter reset signal res2 remains at Low-level, and the value of the signal P_DATA_O [7:4] remains at the value of the (n+1)-th frame.

At the subsequent time t6, the control signal s_read supplied from the horizontal selection circuit 50 to the output switch 38 of the pulse counting unit 30 via the control line 16 transitions from Low-level to High-level. As a result, the output switch 38 is turned on, and a signal P_DATA_O [7:0] in which the output of the sub-counter 32 is set to the lower 4 bits and the output of the sub-counter 34 is set to the upper 4 bits is output to the pixel signal output line 20. In this signal P_DATA_O [7:0], the value of the lower 4 bits is composed of the count value of the (n+2)-th frame, and the value of the upper 4 bits is composed of the count value of the (n+1)-th frame. In other words, two frames of data may be simultaneously obtained.

Since the upper limit count value of the counter is smaller in the second operation mode than in the first operation mode, the second operation mode is assumed to be applied to a scene having a small photon count such as low illuminance imaging, but there is an advantage that image data for two frames may be simultaneously output. In the above description, the two sub-counters 32 and 34 are used, but the number of sub-counters may be three or more. By providing a plurality of sub-counters, image data for a plurality of frames corresponding to the number of sub-counters may be simultaneously output for each frame.

Figure 9:
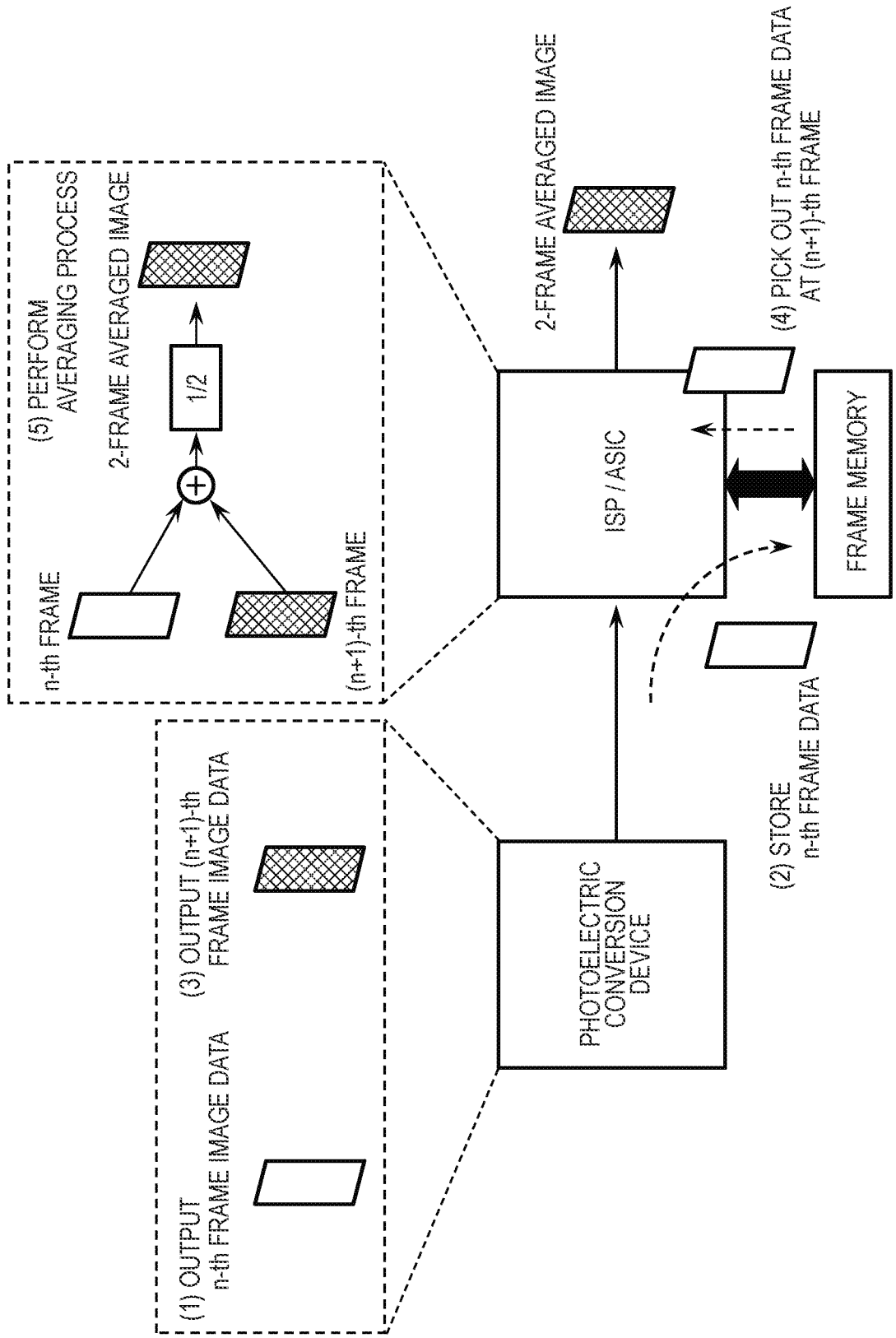
FIG. 9 is a diagram for explaining an averaging processing procedure of image data for two frames (Part 1).
Figure 10:
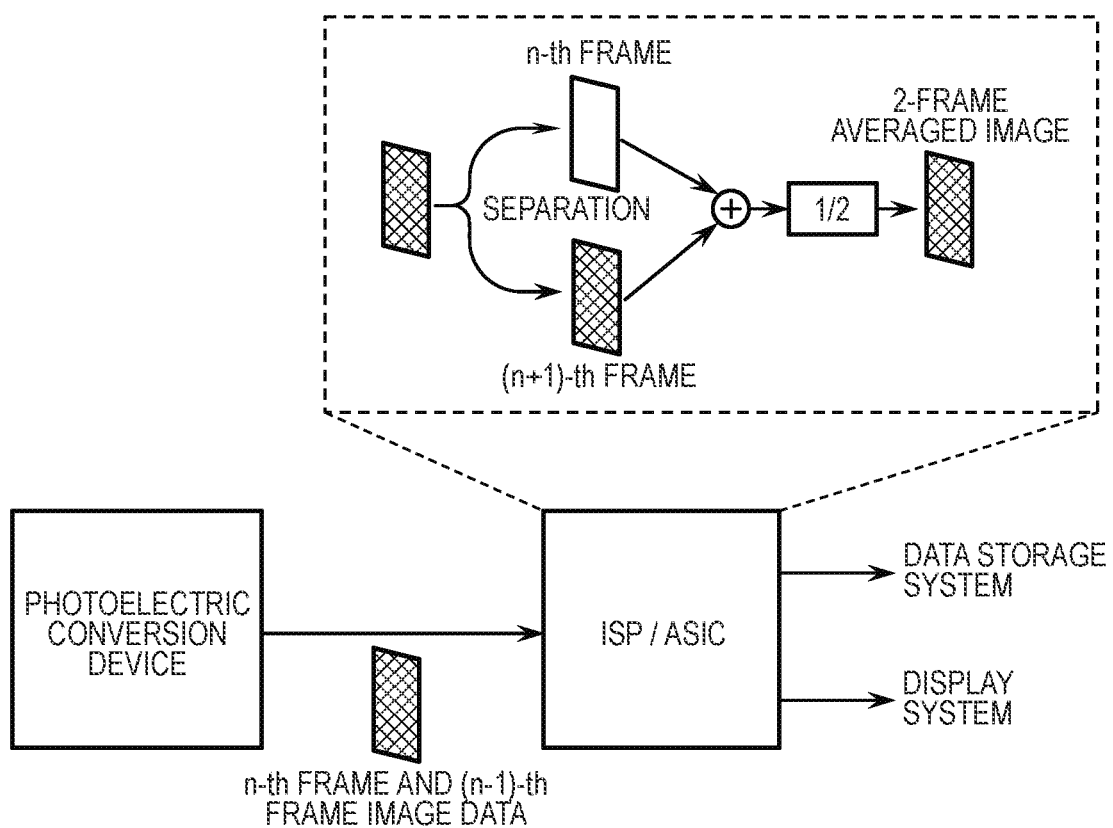
FIG. 10 is a diagram for explaining an averaging processing procedure of image data for two frames (Part 2).

It is useful to configure the photoelectric conversion device so that image data of a plurality of frames may be simultaneously output for each frame in order to reduce the physical size of the whole system and reduce power consumption. The advantages of simultaneously outputting image data for a plurality of frames for each frame will be described below with reference to FIG. 9 and FIG. 10. FIG. 9 and FIG. 10 are diagrams for explaining an averaging processing procedure of image data for two frames.

FIG. 9 is a diagram illustrating a processing procedure in a system using a normal photoelectric conversion device that outputs image data for one frame for each frame. One frame of image data is output from the photoelectric conversion device for each frame. When the image data of the n-th frame and the image data of the next (n+1)-th frame are averaged, the image data of the n-th frame is temporarily stored in an external frame memory, and the image data is picked out from the frame memory at the time of the operation of the (n+1)-th frame. Then, the image data of the n-th frame read out from the frame memory and the image data of the (n+1)-th frame output from the photoelectric conversion device are averaged to perform frame averaging for two frames. The frame averaging may be applied, for example, when performing noise reduction processing. In recent years, the number of pixels of the photoelectric conversion device, i.e., the capacity of data, has been increased, and it is difficult to hold data of a frame image by hardware resources in an ISP or an ASIC. Therefore, a system that performs real-time image processing requires additional elements such as a DRAM used as an external frame memory.

FIG. 10 is a diagram illustrating a processing procedure in a system using the photoelectric conversion device according to the present embodiment that outputs image data of two frames per frame. In the second operation mode of the photoelectric conversion device according to the present embodiment, image data for two frames may be output in an image output period of one frame. In the 8-bit pixel data of each pixel 12 output in the image output period of one frame, the pixel data of the n-th frame is stored in the upper 4 bits and the pixel data of the (n−1)-th frame is stored in the lower 4 bits. Since a processing device such as an ISP or an ASIC disposed at a post-stage of the photoelectric conversion device may simultaneously receive image data of two frames, it does not require an external element for storing data of a previous frame. Thereby, the physical size and power consumption of the whole system may be suppressed, and a more compact system may be constructed.

The first operation mode and the second operation mode described above may be dynamically set in accordance with a photographing scene in response to a request from a processing device such as an ISP, an ASIC, or an FPGA in a post-stage. For example, it is possible to perform an operation of driving in the first operation mode in a scene of high illuminance requiring a large number of count values and a large dynamic range, detecting a change to a scene of low illuminance by the post-stage system, and then shifting to the second operation mode.

Figure 11:
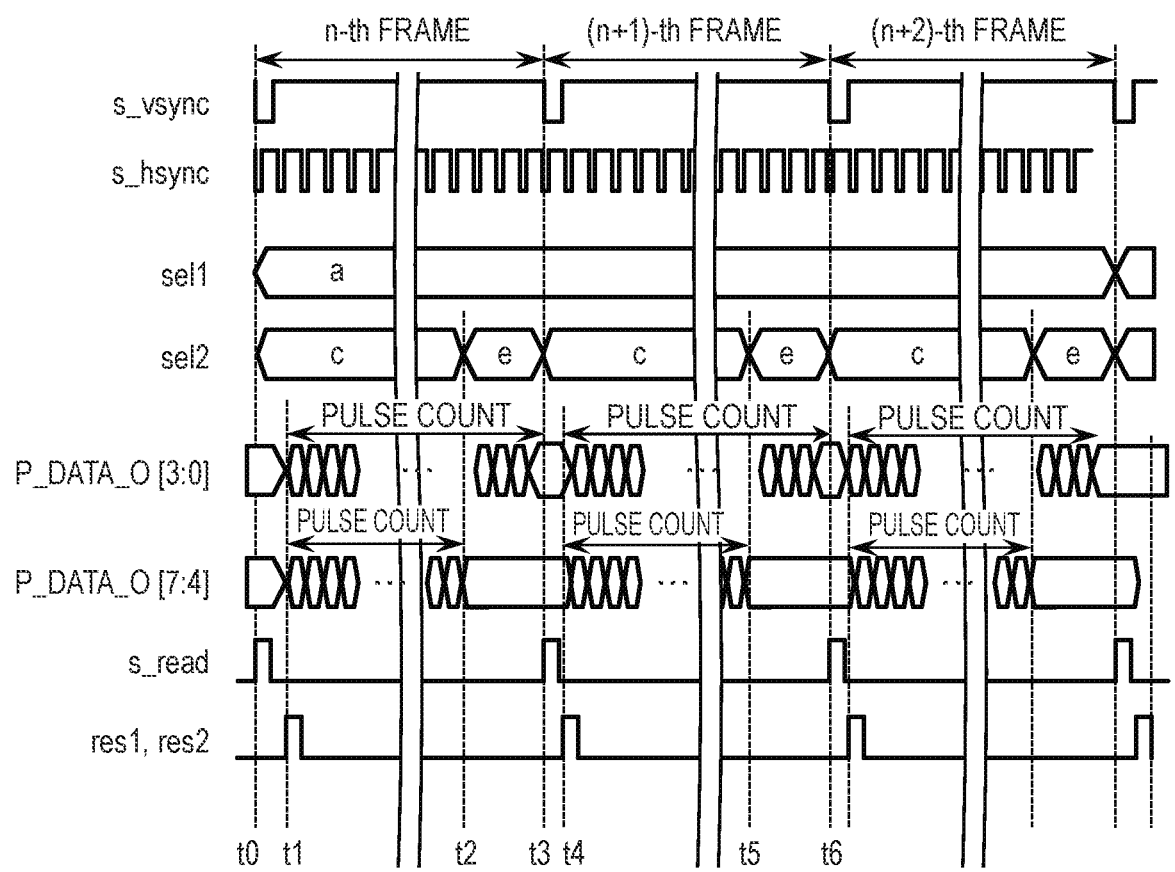

Next, a third operation mode of the photoelectric conversion device according to the present embodiment will be described with reference to FIG. 11. FIG. 11 is a timing chart illustrating a third operation mode of the photoelectric conversion device according to the present embodiment. FIG. 11 illustrates waveforms of the vertical synchronization signal s_vsync, the horizontal synchronization signal s_hsync, the control signal s_read, and the counter reset signals res1 and res2. FIG. 11 also illustrates the values of the selection signals sel1 and sel2 and the values of the signals P_DATA_O [3:0] and P_DATA_O [7:4].

In the first operation mode and the second operation mode, the operation mode is switched on the frame basis, but the operation mode may be switched within one frame. In the third operation mode, the counter connection mode is controlled based on the horizontal synchronization signal s_hsync.

At time t0, the vertical synchronization signal s_vsync transitions from High-level to Low-level, and the operation of the n-th frame is started. The connection mode switching circuit 36 sets the selection signals sel1 and sel2 to the nodes a and c, respectively, according to the vertical synchronization signal s_vsync, the horizontal synchronization signal s_hsync, and the operation mode setting signal cnt_mode indicating the third operation mode (fourth counter connection mode). Thus, each of the sub-counter 32 and the sub-counter 34 operates as a 4-bit counter that counts the number of pulses superimposed on the signal P_PULSE.

At the subsequent time t1, the counter reset signals res1 and res2 supplied from the connection mode switching circuit 36 to the sub-counters 32 and 34 transition from Low-level to High-level. As a result, the count values of the sub-counters 32 and 34 are reset, and the values of the signals P_DATA_O [3:0] and P_DATA_O [7:4] become 0. The period from time t1 to time t2 at which the setting of the selection signal sel2 is switched to the node e next is a first exposure period (pulse count period) of the photoelectric conversion element PD in the n-th frame. The sub-counter 34 counts pulses in the first exposure period. The period from time t1 to time t3 at which the control signal s_read becomes High-level next corresponds to a second exposure period (pulse count period) of the photoelectric conversion element PD in the n-th frame. The sub-counter 32 counts pulses in the second exposure period.

At the subsequent time t2, the connection mode switching circuit 36 sets the selection signal sel2 to the node e in accordance with the vertical synchronization signal s_vsync, the horizontal synchronization signal s_hsync, and the operation mode setting signal cnt_mode indicating the third operation mode (second counter connection mode). Thus, the sub-counter 34 holds the count value until time t2 until the counter reset signal res2 becomes High-level next. At this time, the setting of the selection signal sel1 remains at the node a, and the sub-counter 32 continues counting. The timing (time t2) at which the selection signal sel2 is switched may be set at an arbitrary point in one frame. The selection signal sel2 is normally switched in synchronization with the horizontal synchronization signal s_hsync. For example, the timing of switching the selection signal sel2 may be set as a timing at which the horizontal synchronization signal s_hsync transits from High-level to Low-level n times after the start of the frame (n is an integer equal to or greater than 1).

At the subsequent time t3, the control signal s_read supplied from the horizontal selection circuit 50 to the output switch 38 of the pulse counting unit 30 via the control line 16 transitions from Low-level to High-level. As a result, the output switch 38 is turned on, and the signal P_DATA_O [7:0] in which the output of the sub-counter 32 is set to the lower 4 bits and the output of the sub-counter 34 is set to the upper 4 bits is output to the pixel signal output line 20. In this signal P_DATA_O [7:0], the value of the lower 4 bits is configured by a count value between time t1 and time t3, and the value of the upper 4 bits is configured by a count value between time t1 and time t2. In other words, two frames of data may be simultaneously obtained.

Also at time t3, the vertical synchronization signal s_vsync transitions from High-level to Low-level, and the operation of the (n+1)-th frame is started. The connection mode switching circuit 36 of the pulse counting unit 30 sets the selection signal sel2 to the node c in accordance with the vertical synchronization signal s_vsync, the horizontal synchronization signal s_hsync, and the operation mode setting signal cnt_mode indicating the second operation mode (fourth counter connection mode). Thus, each of the sub-counter 32 and the sub-counter 34 operates as a 4-bit counter that counts the number of pulses superimposed on the signal P_PULSE.

At the subsequent time t4, the counter reset signals res1 and res2 supplied from the connection mode switching circuit 36 to the sub-counters 32 and 34 transition from Low-level to High-level. As a result, the count values of the sub-counters 32 and 34 are reset, and the values of the signals P_DATA_O [3:0] and P_DATA_O [7:4] become 0. The period from time t4 to time t5 at which the setting of the selection signal sel2 is switched to the node e next is the first exposure period (pulse count period) of the photoelectric conversion element PD in the (n+1)-th frame. The sub-counter 34 counts pulses in the first exposure period. The period from time t4 to time t6 at which the control signal s_read becomes High-level next corresponds to the second exposure period (pulse count period) of the photoelectric conversion element PD in the (n+1)-th frame. The sub-counter 32 counts pulses in the second exposure period.

The operation of each frame after the (n+2)-th frame starting from the subsequent time t6 is similar to that of the n-th frame and the (n+1)-th frame.

As described above, in the third operation mode, data of the short pulse count period (the first exposure period) is stored in the upper 4 bits of the signal P_DATA_O [7:0], and data of the long pulse count period (the second exposure period) is stored in the lower 4 bits of the signal P_DATA_O [7:0]. In this way, by switching between the second counter connection mode and the fourth counter connection mode during one frame, two kinds of image data with different pulse count periods may be output.

According to the third operation mode, for example, two kinds of image data having different pulse count periods are simultaneously output to the post-stage system, and data of conditions suitable for image processing may be selected, for example, data not saturated is selected. Although the sub-counters 32 and 34 are configured by the same number of bits in the present embodiment, the sub-counters 32 and 34 may be configured by different numbers of bits, for example, one of them is four bits and the other is eight bits.

As described above, according to the present embodiment, it is possible to output data of a plurality of frames and a result of processing data of a single frame or a plurality of frames from the pixels while suppressing the circuit scale of the pixels.

Second Embodiment

Figure 12:
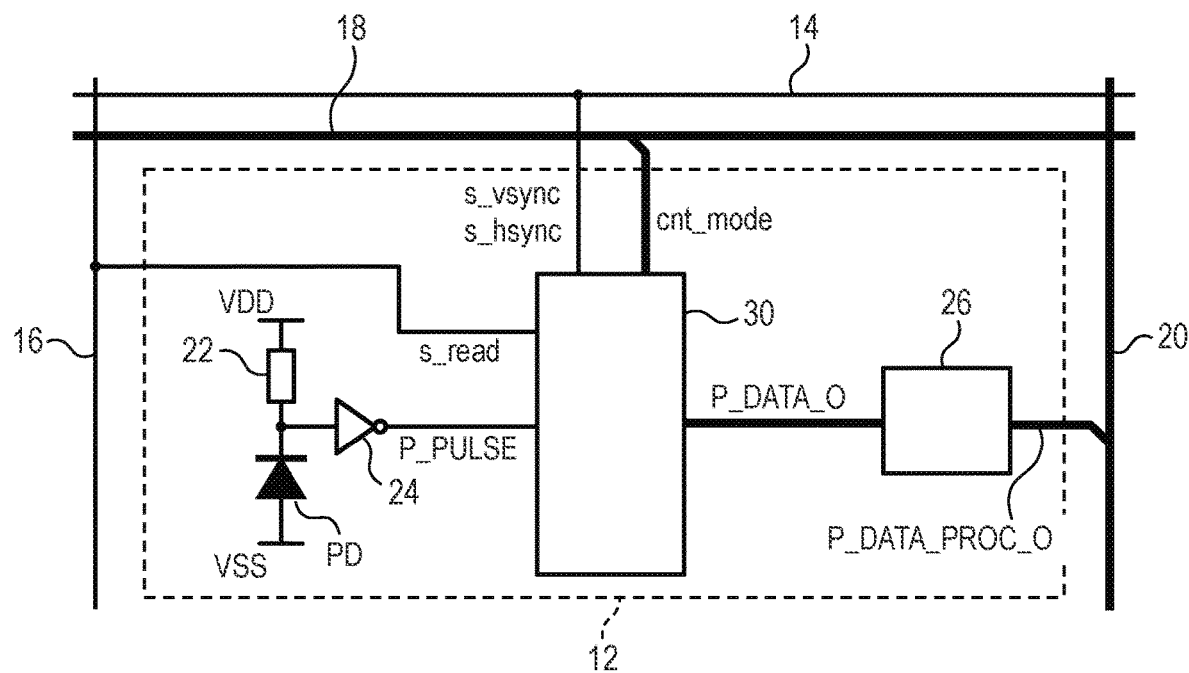
FIG. 12 is a block diagram illustrating a configuration example of a pixel in a photoelectric conversion device according to a second embodiment of the present invention.
Figure 13A:
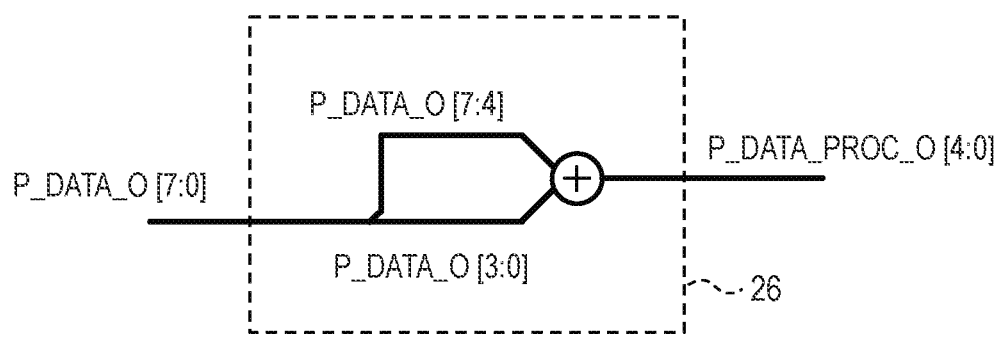
FIG. 13A and FIG. 13B are block diagrams illustrating a configuration example of a signal processing unit in the photoelectric conversion device according to the second embodiment of the present invention.
Figure 13B:
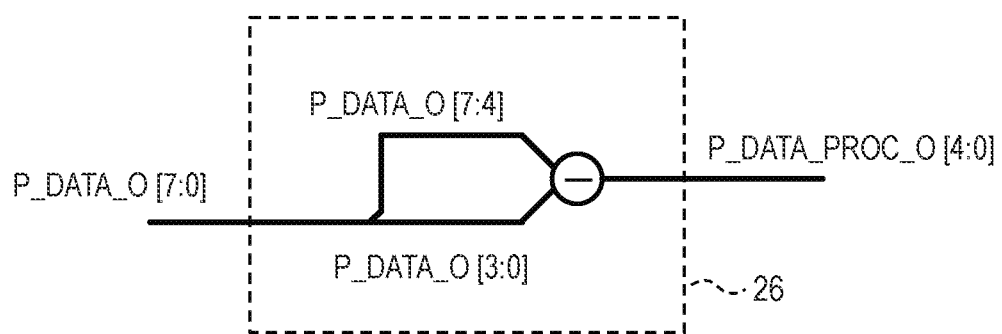

A photoelectric conversion device according to a second embodiment of the present invention will be described with reference to FIG. 12 to FIG. 13B. FIG. 12 is a block diagram illustrating a configuration example of a pixel in the photoelectric conversion device according to the present embodiment. FIG. 13A and FIG. 13B are block diagrams illustrating a configuration example of a signal processing unit in the photoelectric conversion device according to the present embodiment. In the present embodiment, the photoelectric conversion device according to the present embodiment will be mainly described with respect to portions different from the photoelectric conversion device according to the first embodiment, and components similar to those of the photoelectric conversion device according to the first embodiment are denoted by the same reference numerals, and the description thereof will be omitted or simplified.

The photoelectric conversion device according to the present embodiment is the same as the photoelectric conversion device according to the first embodiment except that the configuration of the pixel 12 is different. That is, as illustrated in FIG. 12, the pixel 12 of the present embodiment further includes a signal processing unit 26. The signal processing unit 26 is connected between the pulse counting unit 30 and the pixel signal output line 20. The signal processing unit 26 performs an arithmetic processing such as addition processing and subtraction processing and/or a signal processing such as bit division on the signal P_DATA_O output from the pulse counting unit 30, and outputs the processed signal P_DATA_PROC_O to the pixel signal output line 20. By performing the signal processing such as addition processing in the pixel 12, it becomes possible to output a signal subjected to the processing such as frame averaging from the photoelectric conversion device, and it is possible to reduce loads in a post-stage system such as ISP, ASIC, FPGA, and the like.

FIG. 13A illustrates a configuration example of the signal processing unit 26 in a case where the signal processing unit 26 performs a process of adding image data of two frames. The signal processing unit 26 may output a signal P_DATA_PROC_O [4:0] obtained by adding the lower 4-bit signal P_DATA_O [3:0] and the upper 4-bit signal P_DATA_O [7:4] of the signal P_DATA_O [7:0]. The signals P_DATA_O [3:0] and P_DATA_O [7:4] may be weighted and then added.

FIG. 13B illustrates a configuration example of the signal processing unit 26 in a case of performing subtraction processing of image data in the signal processing unit 26. The signal processing unit 26 may output a signal P_DATA_PROC_O [4:0] obtained by subtracting the signal P_DATA_O [7:4] of the upper 4 bits from the signal P_DATA_O [3:0] of the lower 4 bits of the signal P_DATA_O [7:0]. The signals P_DATA_O [3:0] and P_DATA_O [7:4] may be weighted and then subtracted. By mounting the subtraction circuit in the pixel 12, it is possible to perform differential calculation between frames, and for example, it is possible to be useful for detecting movable objects.

The signal processing described above is an example, and the signal processing unit 26 may include another signal processing circuit. The pixel 12 may further include a circuit for switching the execution and the non-execution of the signal processing according to the value of the image data.

As described above, according to the present embodiment, it is possible to output data of a plurality of frames and a result of processing data of a single frame or a plurality of frames from the pixels while suppressing the circuit scale of the pixels.

Third Embodiment

Figure 14:
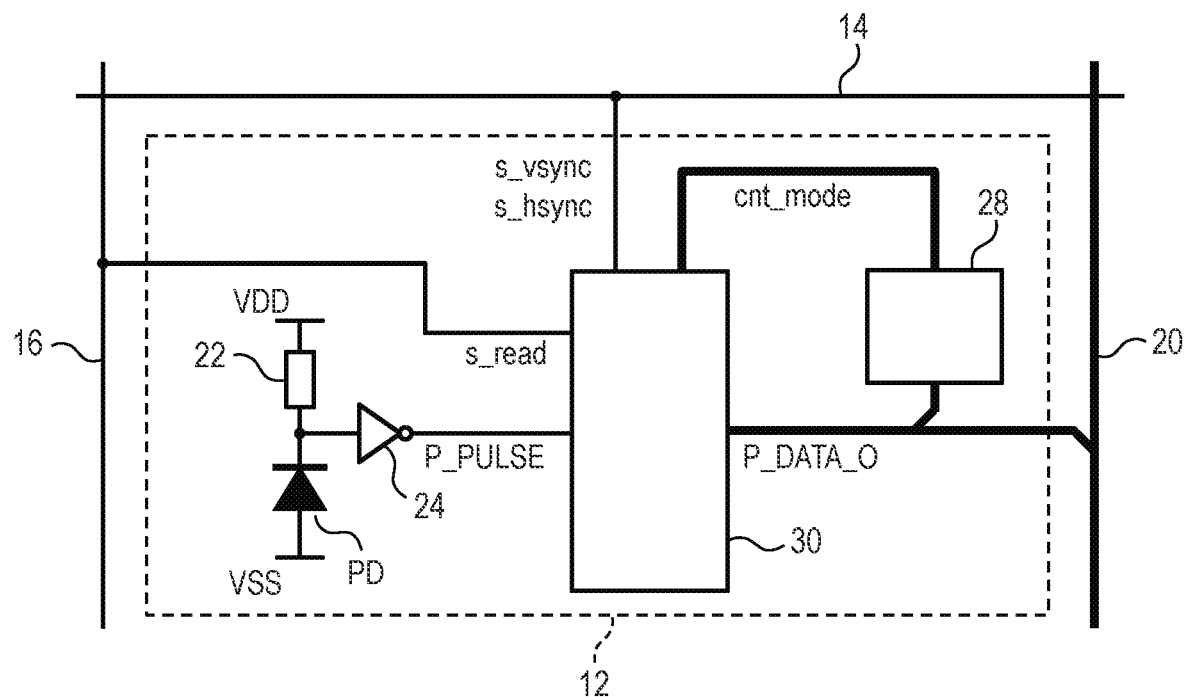
FIG. 14 is a block diagram illustrating a configuration example of a pixel in a photoelectric conversion device according to a third embodiment of the present invention.
Figure 15:
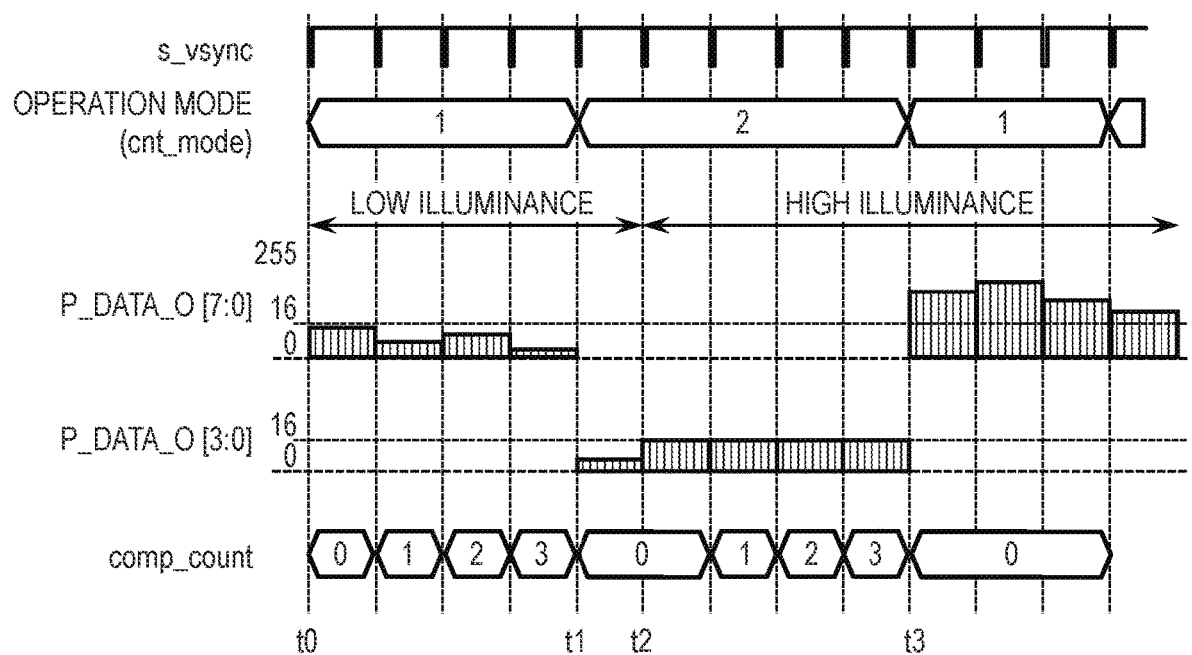
FIG. 15 is a timing chart illustrating a driving example of the photoelectric conversion device according to the third embodiment of the present invention.

A photoelectric conversion device according to a third embodiment of the present invention will be described with reference to FIG. 14 and FIG. 15. FIG. 14 is a block diagram illustrating a configuration example of a pixel in the photoelectric conversion device according to the present embodiment. FIG. 15 is a timing chart illustrating a driving example of the photoelectric conversion device according to the present embodiment. In the present embodiment, the photoelectric conversion device according to the present embodiment will be mainly described with respect to portions different from the photoelectric conversion device according to the first embodiment, and components similar to those of the photoelectric conversion device according to the first embodiment are denoted by the same reference numerals, and the description thereof will be omitted or simplified.

The photoelectric conversion device according to the present embodiment is the same as the photoelectric conversion device according to the first embodiment except that the configuration of the pixel 12 is different. That is, as illustrated in FIG. 14, the pixel 12 of the present embodiment further includes a pixel level determination unit 28. The pixel level determination unit 28 generates an operation mode setting signal cnt_mode based on the signal P_DATA_O received from the pulse counting unit 30, and outputs the generated operation mode setting signal cnt_mode to the pulse counting unit 30. That is, the operation mode setting signal cnt_mode supplied to the pulse counting unit 30 (the connection mode switching circuit 36) is output from the pixel level determination unit 28 instead of from the register block 60. In other words, in the first embodiment, the switching of the operation mode is determined and instructed in the post-stage system, whereas in the present embodiment, the switching of the operation mode is determined and instructed in the pixels 12. By configuring the pixel 12 in this manner, the operation mode may be switched without receiving an instruction of the post-stage system.

The pixel level determination unit 28 monitors the output of the pulse counting unit 30 in the pixel 12, and confirms the count value for each frame. Then, the operation mode of the photoelectric conversion device is switched according to the count value of each frame. For example, when the count value of each frame is low, the operation mode is switched to the second operation mode. The second operation mode is an effective mode when the number of counts is small and the illuminance is low. When the count value of each frame is high, the operation mode is switched to the first operation mode. The first operation mode is an effective operation mode at high illuminance.

Next, an operation example of the photoelectric conversion device according to the present embodiment will be described with reference to FIG. 15. FIG. 15 illustrates a waveform of the vertical synchronization signal s_vsync, an operation mode, and values of the signals P_DATA_O [7:0], P_DATA_O [3:0], and the count value comp_count. The operation mode represents the operation mode setting signal cnt_mode input to the connection mode switching circuit 36, and "1" corresponds to the setting signal of the first operation mode, and "2" corresponds to the setting signal of the second operation mode. The count value comp_count represents a count value of a frame in which the output of the comparator in the pixel level determination unit 28 becomes 1.

At time t0, it is assumed that the photoelectric conversion device is operating in the first operation mode. When operating in the first operation mode, the pixel level determination unit 28 monitors the signal P_DATA_O [7:0] and determines whether the value of the signal P_DATA OUT [7:0] is less than a predetermined value, for example, less than 16. When the value of the signal P_DATA_O [7:0] is less than 16 in a certain frame, the comparator in the pixel level determination unit 28 outputs 1 and counts up the count value comp_count as 1 count. When it is detected that this state continues for a predetermined period of time, for example, four frames, it is determined that a scene with low illuminance is currently captured, and the operation mode is switched to the second operation mode. For example, in the example of FIG. 15, the period from time t0 to time t2 is low illuminance, and the value of the signal P_DATA_O [7:0] is lower than 16. At time t1 when a frame whose value of the signal P_DATA_O [7:0] is less than 16 continues for four frames, the pixel level determination unit 28 switches the operation mode from the first mode to the second mode.

When operating in the second operation mode, the pixel level determination unit 28 monitors the value of the lower 4-bit signal P_DATA_O [3:0] of the output of the pulse counting unit 30, and determines whether or not the value of the signal P_DATA_O [3:0] is saturated, i.e., equal to or greater than a predetermined value. When the value of the signal P_DATA_O [3:0] is saturated in a certain frame, the comparator in the pixel level determination unit 28 outputs 1 and counts up the count value comp_count as 1 count. When it is detected that this state continues for a predetermined period of time, for example, four frames, it is determined that a scene with high illuminance is currently captured, and the operation mode is switched to the first operation mode. For example, in the example of FIG. 15, the period after time t2 is high illuminance, and the value of the signal P_DATA_O [3:0] is saturated. At time t3 when a frame whose value of the signal P_DATA_O [3:0] is saturated continues for four frames, the pixel level determination unit 28 switches the operation mode from the second mode to the first mode which may be captured in a wide dynamic range.

As described above, according to the present embodiment, since the pixel level determination unit 28 in the pixel 12 determines the value of the pixel data and switches the operation mode, it is possible to set the optimal operation mode for each pixel while reducing the load of the post-stage processing system.

Although the configuration in which the pixel level determination unit 28 is combined with the photoelectric conversion device according to the first embodiment has been described in the present embodiment, the pixel level determination unit 28 may be combined with the photoelectric conversion device according to the second embodiment. Further, in the present embodiment, the condition for switching the operation mode is that the low illuminance state or the high illuminance state continues for four frames, but the condition for switching the operation mode may be changed as appropriate. For example, a condition for switching the operation mode may be that a low illuminance state or a high illuminance state continues for a predetermined number of frames of five or more frames.

Fourth Embodiment

Figure 16:
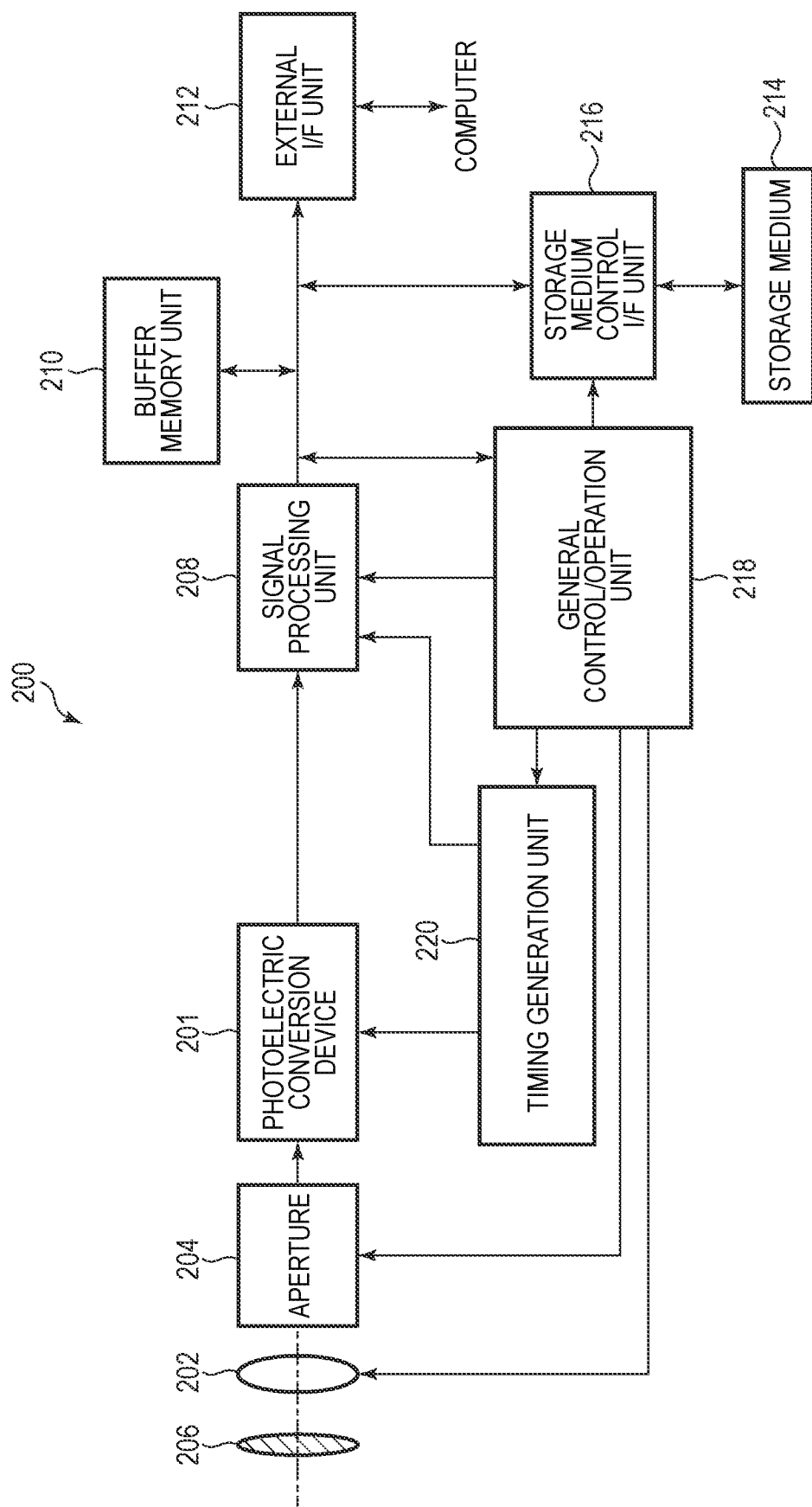
FIG. 16 is a block diagram illustrating a schematic configuration of a photodetection system according to a fourth embodiment of the present invention.

A photodetection system according to a fourth embodiment of the present invention will be described with reference to FIG. 16. FIG. 16 is a block diagram illustrating a schematic configuration of the photodetection system according to the present embodiment. In the present embodiment, a photodetection sensor to which the photoelectric conversion device 100 according to any one of the first to third embodiments is applied will be described.

The photoelectric conversion device 100 described in the first to third embodiments may be applied to various photodetection systems. Examples of applicable photodetection systems include imaging systems such as digital still cameras, digital camcorders, surveillance cameras, copying machines, facsimiles, mobile phones, on-vehicle cameras, observation satellites, and the like. A camera module including an optical system such as a lens and an imaging device is also included in the photodetection system. FIG. 16 is a block diagram of a digital still camera as an example of these.

The photodetection system 200 illustrated in FIG. 16 includes a photoelectric conversion device 201, a lens 202 for forming an optical image of an object on the photoelectric conversion device 201, an aperture 204 for varying the amount of light passing through the lens 202, and a barrier 206 for protecting the lens 202. The lens 202 and the aperture 204 are optical systems for focusing light on the photoelectric conversion device 201. The photoelectric conversion device 201 is the photoelectric conversion device 100 described in any of the first to third embodiments, and converts the optical image formed by the lens 202 into image data.

The photodetection system 200 also includes a signal processing unit 208 that processes an output signal output from the photoelectric conversion device 201. The signal processing unit 208 generates image data from the digital signal output from the photoelectric conversion device 201. The signal processing unit 208 performs various corrections and compressions as necessary to output image data. The photoelectric conversion device 201 may include an AD (Analog to Digital) conversion unit that generates a digital signal to be processed by the signal processing unit 208. The AD conversion unit may be formed on a semiconductor layer (semiconductor substrate) on which the photon detection element of the photoelectric conversion device 201 is formed, or may be formed on a semiconductor substrate different from the semiconductor layer on which the photon detection element of the photoelectric conversion device 201 is formed. The signal processing unit 208 may be formed on the same semiconductor substrate as the photoelectric conversion device 201.

The photodetection system 200 further includes a buffer memory unit 210 for temporarily storing image data, and an external interface unit (external I/F unit) 212 for communicating with an external computer or the like. Further, the photodetection system 200 includes a storage medium 214 such as a semiconductor memory for storing or reading out captured image data, and a storage medium control interface unit (storage medium control I/F unit) 216 for storing or reading out image data on or from the storage medium 214. The storage medium 214 may be built in the photodetection system 200, or may be detachable. Further, communication between the storage medium control I/F unit 216 and the storage medium 214 and communication from the external I/F unit 212 may be performed wirelessly.

Further, the photodetection system 200 includes a general control/operation unit 218 that controls various calculations and the entire digital still camera, and a timing generation unit 220 that outputs various timing signals to the photoelectric conversion device 201 and the signal processing unit 208. Here, the timing signal or the like may be input from the outside, and the photodetection system 200 may include at least the photoelectric conversion device 201 and a signal processing unit 208 that processes an output signal output from the photoelectric conversion device 201. The timing generation unit 220 may be mounted on the photoelectric conversion device 201. Further, the general control/operation unit 218 and the timing generation unit 220 may be configured to implement some or all of the control functions of the photoelectric conversion device 201.

The photoelectric conversion device 201 outputs an imaging signal to the signal processing unit 208. The signal processing unit 208 performs predetermined signal processing on the imaging signal output from the photoelectric conversion device 201, and outputs image data. The signal processing unit 208 generates an image using the imaging signal. The signal processing unit 208 may be configured to perform a distance measurement operation on a signal output from the photoelectric conversion device 201.

As described above, according to the present embodiment, by configuring the photodetection system using the photoelectric conversion device according to any of the first to third embodiments, it is possible to realize a photodetection system capable of obtaining a higher quality image.

Fifth Embodiment

Figure 17:
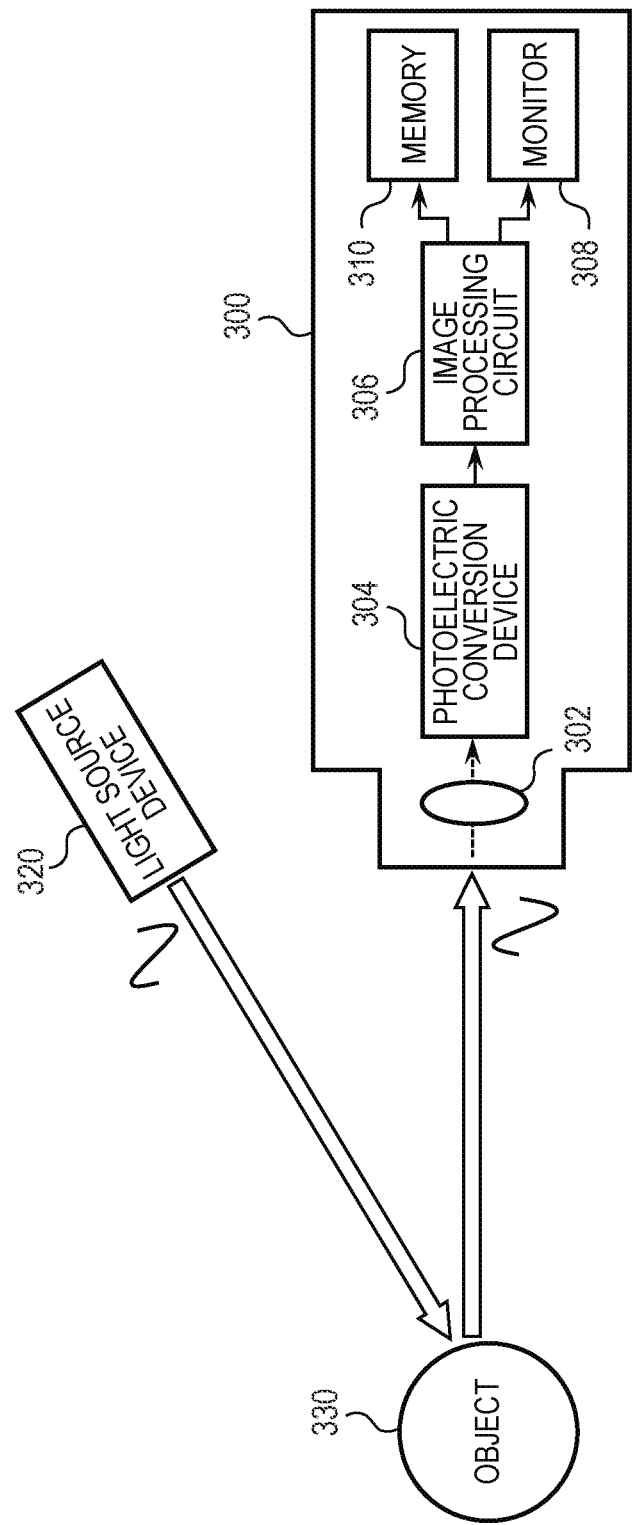
FIG. 17 is a block diagram illustrating a schematic configuration of a range image sensor according to a fifth embodiment of the present invention.

A range image sensor according to a fifth embodiment of the present invention will be described with reference to FIG. 17. FIG. 17 is a block diagram illustrating a schematic configuration of the range image sensor according to the present embodiment. In the present embodiment, a range image sensor will be described as an example of a photodetection system to which the photoelectric conversion device 100 according to any one of the first to third embodiments is applied.

As illustrated in FIG. 17, the range image sensor 300 according to the present embodiment may include an optical system 302, a photoelectric conversion device 304, an image processing circuit 306, a monitor 308, and a memory 310. The range image sensor 300 receives light (modulated light or pulse light) emitted from a light source device 320 toward an object 330 and reflected by the surface of the object 330, and acquires a distance image corresponding to the distance to the object 330.

The optical system 302 includes one or a plurality of lenses, and has a role of forming an image of image light (incident light) from the object 330 on a light receiving surface (sensor unit) of the photoelectric conversion device 304.

The photoelectric conversion device 304 is the photoelectric conversion device 100 described in any of the first to third embodiments, and has a function of generating a distance signal indicating the distance to the object 330 based on the image light from the object 330 and supplying the generated distance signal to the image processing circuit 306.

The image processing circuit 306 has a function of performing image processing for constructing a distance image based on the distance signal supplied from the photoelectric conversion device 304.

The monitor 308 has a function of displaying a distance image (image data) obtained by image processing in the image processing circuit 306. The memory 310 has a function of storing (recording) a distance image (image data) obtained by image processing in the image processing circuit 306.

As described above, according to the present embodiment, by configuring the range image sensor using the photoelectric conversion device according to any of the first to third embodiments, it is possible to realize a range image sensor capable of acquiring a distance image including more accurate distance information in conjunction with improvement in characteristics of the pixels 12.

Sixth Embodiment

Figure 18:
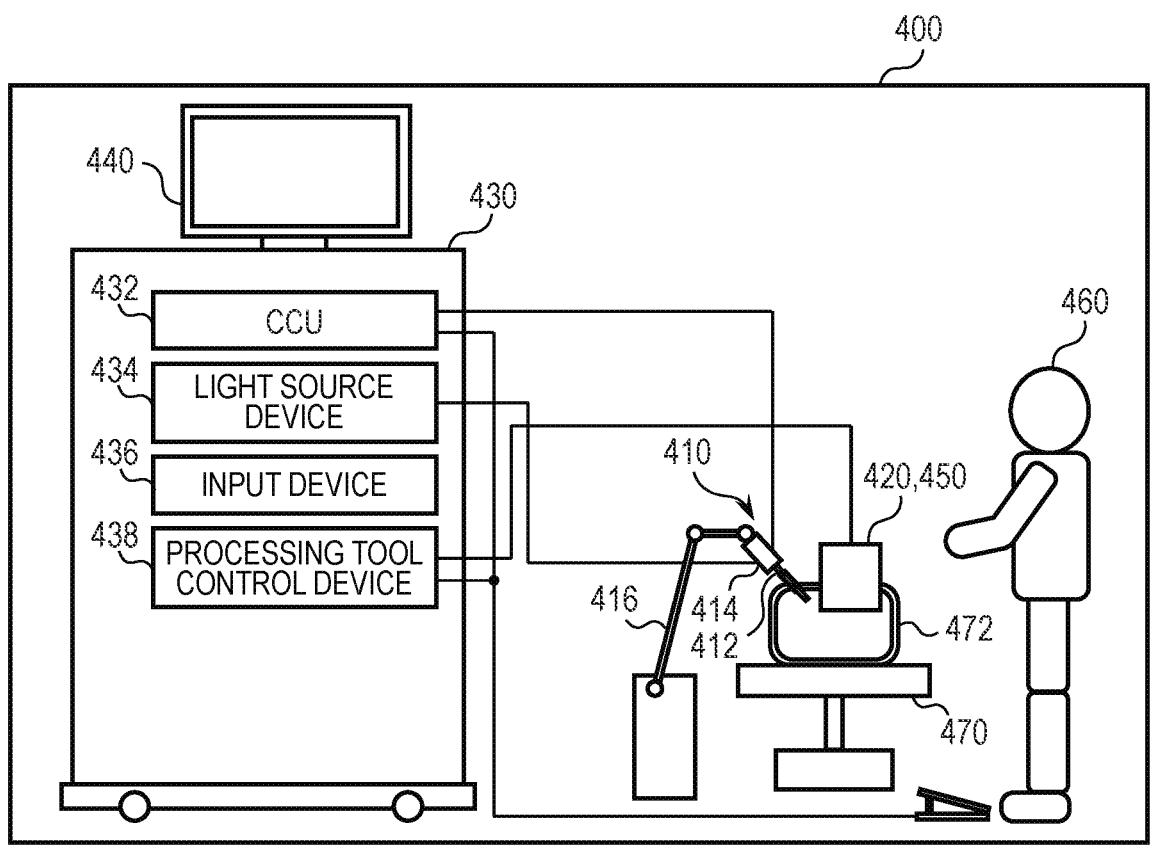
FIG. 18 is a schematic diagram illustrating a configuration example of an endoscopic surgical system according to a sixth embodiment of the present invention.

An endoscopic surgical system according to a sixth embodiment of the present invention will be described with reference to FIG. 18. FIG. 18 is a schematic diagram illustrating a configuration example of the endoscopic surgical system according to the present embodiment. In the present embodiment, an endoscopic surgical system will be described as an example of a photodetection system to which the photoelectric conversion device 100 described in any one of the first to third embodiments is applied.

FIG. 18 illustrates a state in which an operator (surgeon) 460 performs a surgery on a patient 472 on a patient bed 470 using an endoscopic surgical system 400.

As illustrated in FIG. 18, the endoscopic surgical system 400 according to the present embodiment may include an endoscope 410, a surgical tool 420, and a cart 430 on which various devices for endoscopic surgery are mounted. The cart 430 may include a CCU (Camera Control Unit) 432, a light source device 434, an input device 436, a processing tool control device 438, a display device 440, and the like.

The endoscope 410 includes a lens barrel 412 in which an area of a predetermined length from the tip is inserted into the body cavity of the patient 472, and a camera head 414 connected to the base end of the lens barrel 412. Although FIG. 18 illustrates an endoscope 410 configured as a rigid mirror having a rigid lens barrel 412, the endoscope 410 may be configured as a flexible mirror having a flexible lens barrel. The endoscope 410 is held in a movable state by an arm 416.

An opening into which the objective lens is fitted is provided at the tip of the lens barrel 412. The light source device 434 is connected to the endoscope 410, and light generated by the light source device 434 is guided to the tip of the lens barrel 412 by a light guide extended inside the lens barrel 412, and is irradiated to an observation target in the body cavity of the patient 472 via an objective lens. The endoscope 410 may be a direct-viewing mirror, an oblique-viewing mirror, or a side-viewing mirror.

An optical system and a photoelectric conversion device (not illustrated) are provided inside the camera head 414, and reflected light (observation light) from the observation target is focused on the photoelectric conversion device by the optical system. The photoelectric conversion device photoelectrically converts the observation light and generates an electric signal corresponding to the observation light, i.e., an image signal corresponding to the observation image. As the photoelectric conversion device, the photoelectric conversion device 100 described in any of the first to third embodiments may be used. The image signal is transmitted to the CCU 432 as RAW data.

The CCU 432 is configured by a CPU (Central Processing Unit), a GPU (Graphics Processing Unit), and the like, and integrally controls the operation of the endoscope 410 and the display device 440. Further, the CCU 432 receives an image signal from the camera head 414, and performs various types of image processing for displaying an image based on the image signal, such as development processing (demosaic processing), on the image signal.

The display device 440 displays an image based on the image signal subjected to the image processing by the CCU 432 under the control of the CCU 432.

The light source device 434 is configured by, for example, a light source such as an LED (Light Emitting Diode), and supplies irradiation light to the endoscope 410 when capturing an image of a surgical part or the like.

The input device 436 is an input interface for the endoscopic surgical system 400. The user may input various kinds of information and instructions to the endoscopic surgical system 400 via the input device 436.

The processing tool control device 438 controls the actuation of the energy processing tool 450 for tissue ablation, incision, blood vessel sealing, etc.

The light source device 434 for supplying the irradiation light to the endoscope 410 when capturing an image of the surgical part may be composed of a white light source composed of, for example, an LED, a laser light source, or a combination thereof. When a white light source is constituted by a combination of RGB laser light sources, since the output intensity and output timing of each color (each wavelength) may be controlled with high accuracy, the white balance of the captured image may be adjusted in the light source device 434. In this case, the observation object is irradiated with the laser light from each of the RGB laser light sources in a time division manner, and the driving of the imaging element of the camera head 414 is controlled in synchronization with the irradiation timing, whereby the images corresponding to the RGB light sources may be captured in a time division manner. According to this method, a color image may be obtained without providing a color filter in the imaging element.

Further, the driving of the light source device 434 may be controlled so as to change the intensity of the output light every predetermined time. By controlling the driving of the imaging element of the camera head 414 in synchronization with the timing of changing the intensity of the light to acquire images in a time-division manner and compositing the images, it is possible to generate an image in a high dynamic range without so-called blocked up shadows and blown out highlights.

The light source device 434 may be configured to be capable of supplying light in a predetermined wavelength band corresponding to the special light observation. In the special light observation, for example, wavelength dependency of light absorption in body tissue is utilized. Specifically, a predetermined tissue such as a blood vessel in the surface layer of the mucosa is imaged with high contrast by irradiating light in a narrower band compared to the irradiation light (i.e., white light) during normal observation. Alternatively, in the special light observation, fluorescence observation for obtaining an image by fluorescence generated by irradiation with excitation light may be performed. In the fluorescence observation, the body tissue may be irradiated with excitation light to observe fluorescence from the body tissue, or a reagent such as indocyanine green (ICG) may be locally poured into the body tissue, and the body tissue may be irradiated with excitation light corresponding to the fluorescence wavelength of the reagent to obtain a fluorescence image. The light source device 434 may be configured to supply narrowband light and/or excitation light corresponding to such special light observation.

As described above, according to the present embodiment, by configuring the endoscopic surgical system using the photoelectric conversion device according to any of the first to third embodiments, it is possible to realize an endoscopic surgical system capable of acquiring images of better quality.

Seventh Embodiment

Figure 19A:
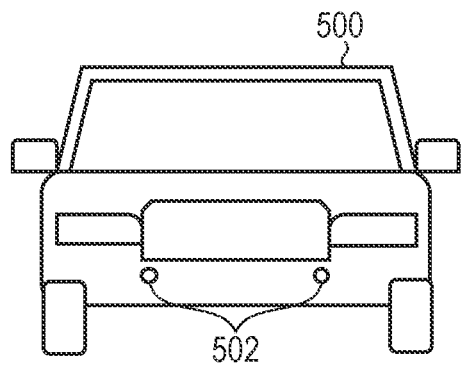
FIG. 19A, FIG. 19B, and FIG. 19C are schematic diagrams illustrating a configuration example of a movable object according to a seventh embodiment of the present invention.
Figure 19B:
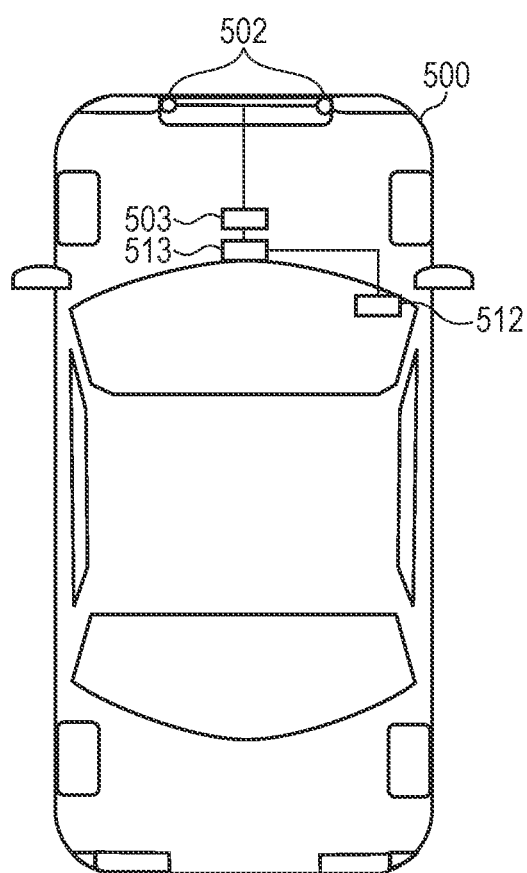
Figure 19C:
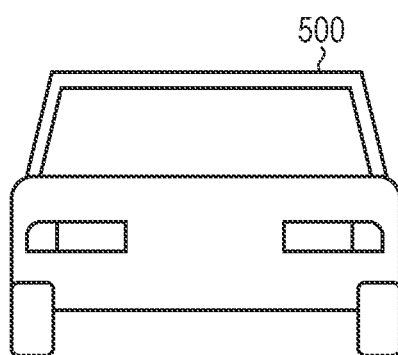
Figure 20:
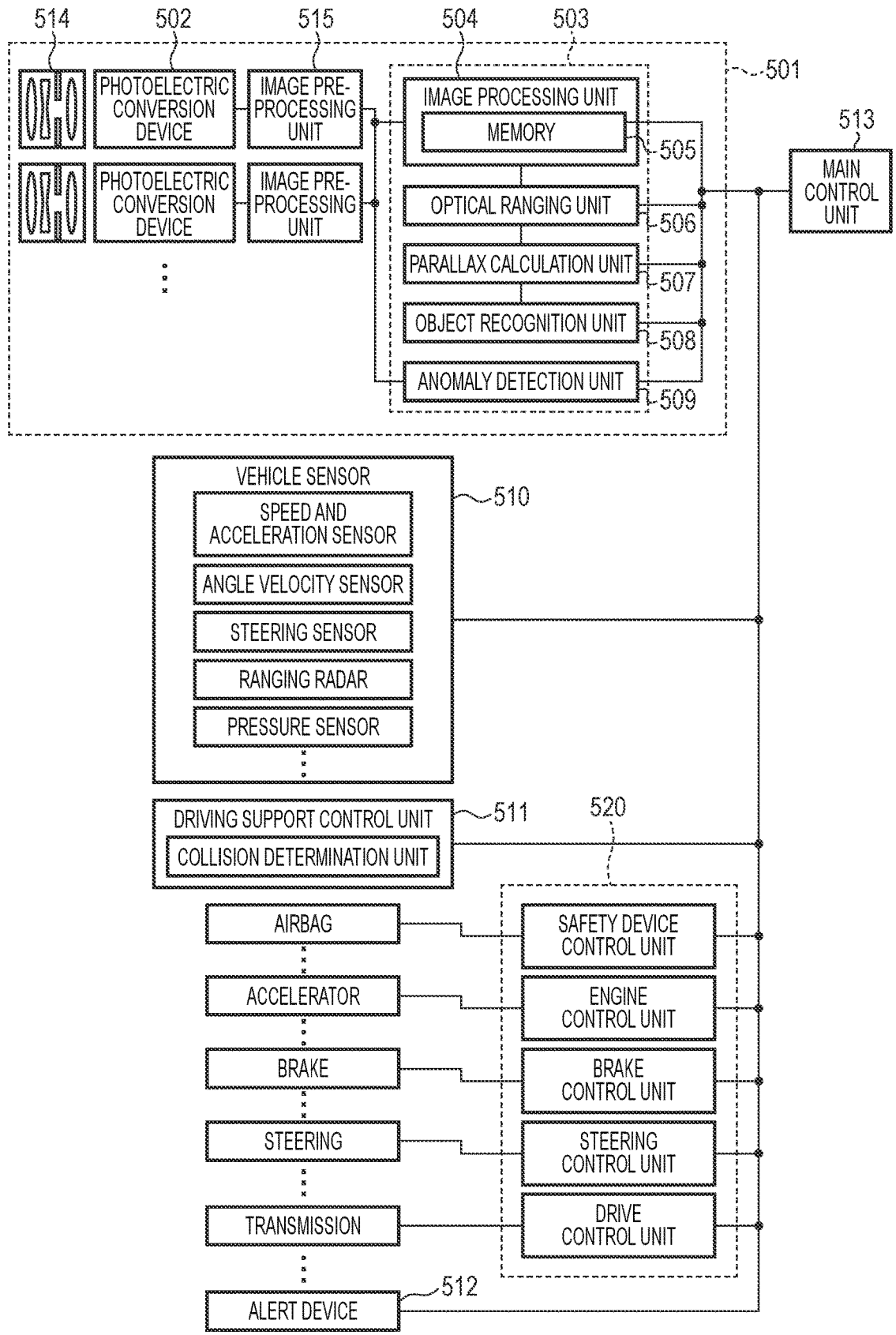
FIG. 20 is a block diagram illustrating a schematic configuration of a photodetection system according to the seventh embodiment of the present invention.
Figure 21:
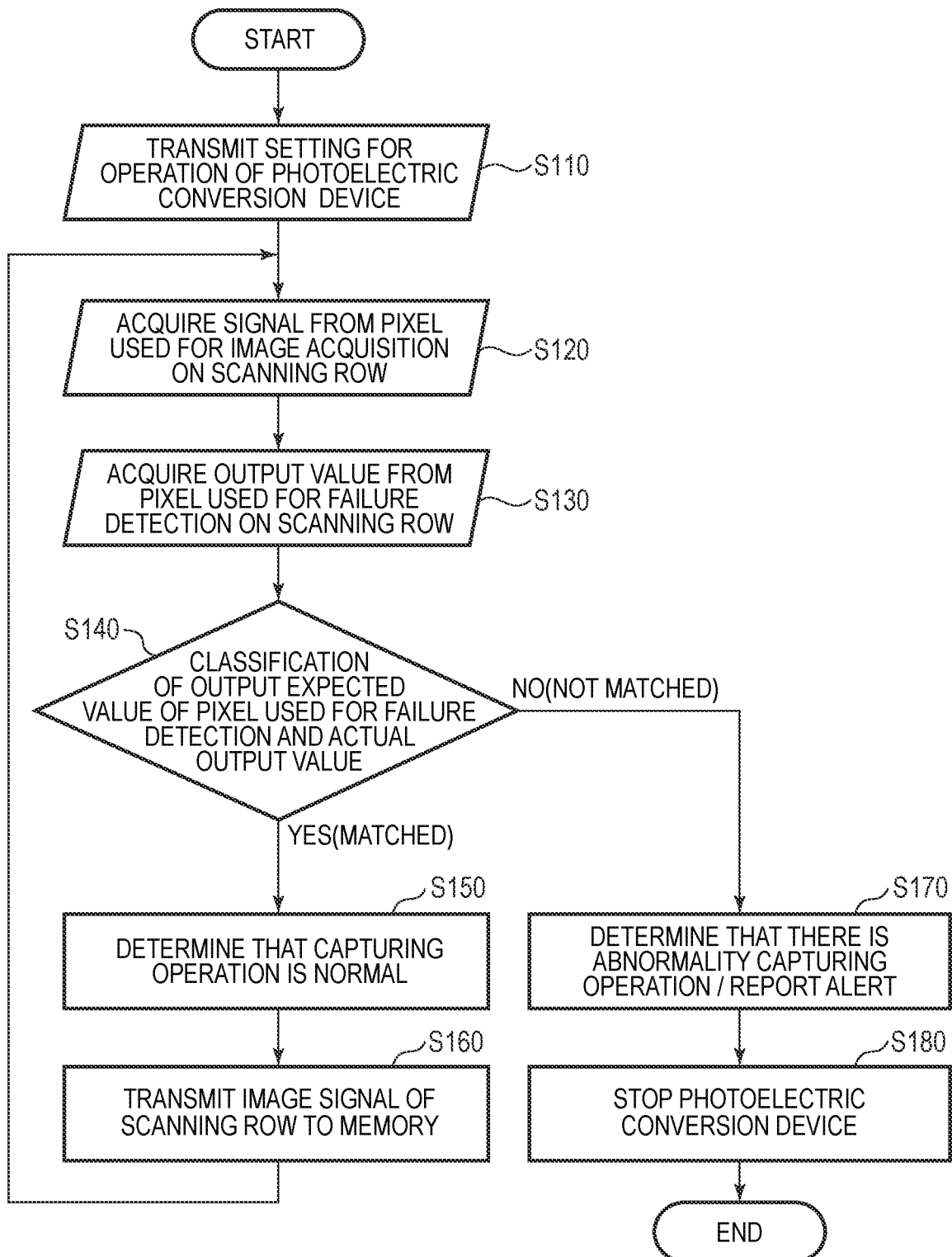
FIG. 21 is a flowchart illustrating an operation of the photodetection system according to the seventh embodiment of the present invention.

A photodetection system and a movable object according to a seventh embodiment of the present invention will be described with reference to FIG. 19A to FIG. 21. FIG. 19A to FIG. 19C are schematic diagrams illustrating a configuration example of a movable object according to the present embodiment. FIG. 20 is a block diagram illustrating a schematic configuration of a photodetection system according to the present embodiment. FIG. 21 is a flowchart illustrating an operation of the photodetection system according to the present embodiment. In the present embodiment, an application example to an on-vehicle camera will be described as a photodetection system to which the photoelectric conversion device 100 described in any one of the first to third embodiments is applied.

FIG. 19A to FIG. 19C are schematic diagrams illustrating a configuration example of a movable object (a vehicle system) according to the present embodiment. FIG. 19A to FIG. 19C illustrate a configuration of a vehicle 500 (an automobile) as an example of a vehicle system incorporating a photodetection system to which the photoelectric conversion device described in any one of the first to third embodiments is applied. FIG. 19A is a schematic front view of the vehicle 500, FIG. 19B is a schematic plan view of the vehicle 500, and FIG. 19C is a schematic rear view of the vehicle 500. The vehicle 500 includes a pair of photoelectric conversion devices 502 on the front side thereof. Here, the photoelectric conversion devices 502 are the photoelectric conversion device 100 described in any of the first to third embodiments. The vehicle 500 includes an integrated circuit 503, an alert device 512, and a main control unit 513.

FIG. 20 is a block diagram illustrating a configuration example of a photodetection system 501 mounted on the vehicle 500. The photodetection system 501 includes a photoelectric conversion device 502, an image preprocessing unit 515, an integrated circuit 503, and an optical system 514. The photoelectric conversion device 502 is the photoelectric conversion device 100 described in any of the first to third embodiments. The optical system 514 forms an optical image of an object on the photoelectric conversion device 502. The photoelectric conversion device 502 converts the optical image of the object formed by the optical system 514 into an electric signal. The image preprocessing unit 515 performs predetermined signal processing on the signal output from the photoelectric conversion device 502. The function of the image preprocessing unit 515 may be incorporated in the photoelectric conversion device 502. The photodetection system 501 is provided with at least two sets of the optical system 514, the photoelectric conversion device 502, and the image preprocessing unit 515, and outputs from the image preprocessing units 515 of each set are input to the integrated circuit 503.

The integrated circuit 503 is an integrated circuit for use in an imaging system, and includes an image processing unit 504, an optical ranging unit 506, a parallax calculation unit 507, an object recognition unit 508, and an abnormality detection unit 509. The image processing unit 504 processes the image signal output from the image preprocessing unit 515. For example, the image processing unit 504 performs image processing such as development processing and defect correction on the output signal of the image preprocessing unit 515. The image processing unit 504 includes a memory 505 for temporarily storing image signals. The memory 505 may store, for example, the position of a known defective pixel in the photoelectric conversion device 502.

The optical ranging unit 506 performs focusing and distance measurement of the object. The parallax calculation unit 507 calculates distance measurement information (distance information) from a plurality of image data (parallax images) acquired by the plurality of photoelectric conversion devices 502. Each of the photoelectric conversion devices 502 may have a configuration capable of acquiring various kinds of information such as distance information. The object recognition unit 508 recognizes an object such as a vehicle, a road, a sign, or a person. When the abnormality detection unit 509 detects an abnormality of the photoelectric conversion device 502, the abnormality detection unit 509 notifies the main control unit 513 of the abnormality.

The integrated circuit 503 may be implemented by dedicated hardware, software modules, or a combination thereof. Further, it may be implemented by FPGA (Field Programmable Gate Array), ASIC (Application Specific Integrated Circuit), or the like, or may be implemented by a combination of these.

The main control unit 513 collectively controls the operations of the photodetection system 501, the vehicle sensor 510, the control unit 520, and the like. The vehicle 500 may not include the main control unit 513. In this case, the photoelectric conversion device 502, the vehicle sensor 510, and the control unit 520 transmit and receive control signals via a communication network. For example, the CAN (Controller Area Network) standard may be applied to transmit and receive the control signals.

The integrated circuit 503 has a function of receiving a control signal from the main control unit 513 or transmitting a control signal and a setting value to the photoelectric conversion device 502 by its own control unit.

The photodetection system 501 is connected to the vehicle sensor 510, and may detect a traveling state of the own vehicle such as a vehicle speed, a yaw rate, a steering angle, and the like, an environment outside the own vehicle, and states of other vehicles and obstacles. The vehicle sensor 510 is also a distance information acquisition means for acquiring distance information to the object. The photodetection system 501 is connected to a driving support control unit 511 that performs various driving support functions such as an automatic steering function, an automatic cruising function, and a collision prevention function. In particular, with regard to the collision determination function, based on the detection results of the photodetection system 501 and the vehicle sensor 510, it is determined whether or not there is a collision with another vehicle or an obstacle. Thus, avoidance control when a collision is estimated and activation of the safety device at the time of collision are performed.

The photodetection system 501 is also connected to an alert device 512 that issues an alert to the driver based on the determination result of the collision determination unit. For example, when the collision possibility is high as the determination result of the collision determination unit, the main control unit 513 performs vehicle control to avoid collision and reduce damage by braking, returning an accelerator, suppressing engine output, or the like. The alert device 512 alerts a user by sounding an alarm such as a sound, displaying alert information on a display screen of a car navigation system or a meter panel, or applying vibration to a seat belt or a steering wheel.

In the present embodiment, the photodetection system 501 images the periphery of the vehicle, for example, the front side or the rear side. FIG. 19B illustrates an example of the arrangement of the photodetection system 501 when the photodetection system 501 captures an image in front of the vehicle.

As described above, the photoelectric conversion device 502 is disposed in front of the vehicle 500. More specifically, when a center line with respect to a forward/backward direction of the vehicle 500 or an outer shape (e.g., a vehicle width) is regarded as a symmetry axis, and two photoelectric conversion devices 502 are disposed axisymmetrically with respect to the symmetry axis, it is preferable to acquire distance information between the vehicle 500 and an object to be imaged and to determine a collision possibility. Further, it is preferable that the photoelectric conversion device 502 is disposed so as not to obstruct the field of view of the driver when the driver sees a situation outside the vehicle 500 from the driver's seat. The alert device 512 is preferably arranged to be easy to enter the field of view of the driver.

Next, a failure detection operation of the photoelectric conversion device 502 in the photodetection system 501 will be described with reference to FIG. 21. The failure detection operation of the photoelectric conversion device 502 may be performed according to steps S110 to S180 illustrated in FIG. 21.

Step S110 is a step of performing setting at the time of startup of the photoelectric conversion device 502. That is, a setting for the operation of the photoelectric conversion device 502 is transmitted from the outside of the photodetection system 501 (for example, the main control unit 513) or from the inside of the photodetection system 501, and the imaging operation and the failure detection operation of the photoelectric conversion device 502 are started.

Next, in step S120, pixel signals are acquired from the effective pixels. In step S130, an output value from the failure detection pixel provided for failure detection is acquired. The failure detection pixel includes a photoelectric conversion element as in the case of the effective pixels. A predetermined voltage is written to the photoelectric conversion element. The failure detection pixel outputs a signal corresponding to the voltage written to the photoelectric conversion element. Step S120 and step S130 may be reversed.

Next, in step S140, a classification of the output expected value of the failure detection pixel and the actual output value from the failure detection pixel is performed. As a result of the classification in step S140, when the output expected value matches the actual output value, the process proceeds to step S150, it is determined that the imaging operation is normally performed, and the process proceeds to step S160. In step S160, the pixel signals of the scanning row are transmitted to the memory 505 to temporarily store them. After that, the process returns to step S120 to continue the failure detection operation. On the other hand, as a result of the classification in step S140, when the output expected value does not match the actual output value, the processing step proceeds to step S170. In step S170, it is determined that there is an abnormality in the imaging operation, and an alert is notified to the main control unit 513 or the alert device 512. The alert device 512 causes the display unit to display that an abnormality has been detected. Thereafter, in step S180, the photoelectric conversion device 502 is stopped, and the operation of the photodetection system 501 is terminated.

Although the present embodiment exemplifies the example in which the flowchart is looped for each row, the flowchart may be looped for each plurality of rows, or the failure detection operation may be performed for each frame. The alert of step S170 may be notified to the outside of the vehicle via the wireless network.

Further, in the present embodiment, the control in which the own vehicle does not collide with other vehicles has been described, but the present invention is also applicable to a control in which the own vehicle is automatically driven following another vehicle, a control in which the own vehicle is automatically driven so as not to go out of the lane, and the like. Further, the photodetection system 501 may be applied not only to a vehicle such as an own vehicle but also to, for example, other movable objects (moving devices) such as a ship, an aircraft, or an industrial robot. In addition, the present invention may be applied not only to a movable object but also to equipment using object recognition in a wide range such as an intelligent transport system (ITS).

Eighth Embodiment

Figure 22A:
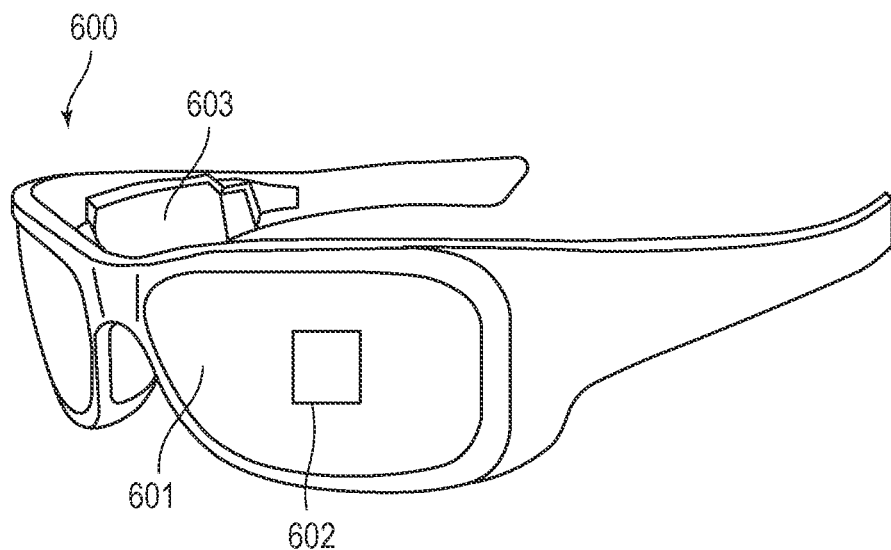
FIG. 22A and FIG. 22B are schematic diagrams illustrating a schematic configuration of a photodetection system according to an eighth embodiment of the present invention.
Figure 22B:
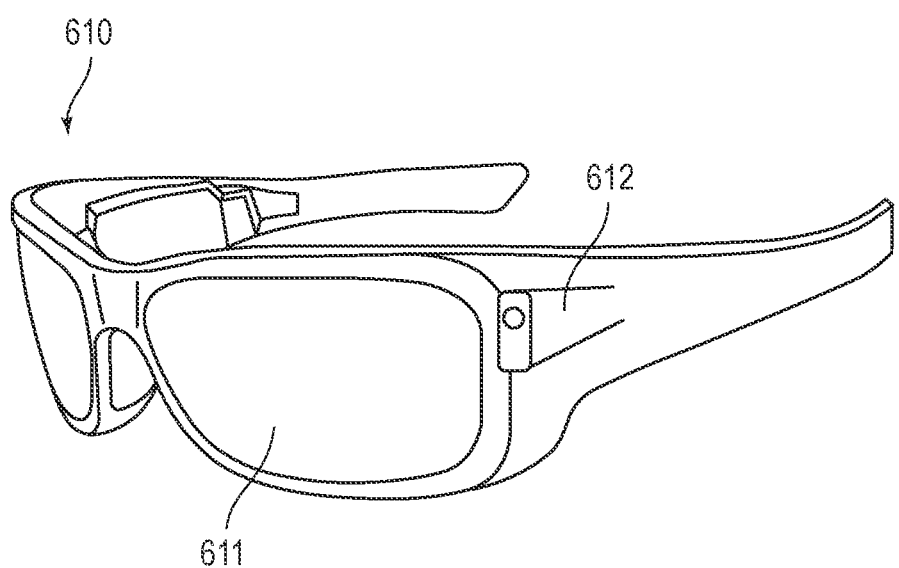

A photodetection system according to an eighth embodiment of the present invention will be described with reference to FIG. 22A and FIG. 22B. FIG. 22A and FIG. 22B are schematic diagrams illustrating a configuration example of a photodetection system according to the present embodiment. In the present embodiment, an application example to eyeglasses (smartglasses) will be described as a photodetection system to which the photoelectric conversion device 100 described in any one of the first to third embodiments is applied.

FIG. 22A illustrates eyeglasses 600 (smartglasses) according to one application example. The eyeglasses 600 include lenses 601, a photoelectric conversion device 602, and a control device 603.

The photoelectric conversion device 602 is the photoelectric conversion device 100 described in any of the first to third embodiments, and is provided on the lens 601. One photoelectric conversion device 602 or a plurality of photoelectric conversion devices 602 may be provided on the lens 601. When a plurality of photoelectric conversion devices 602 is used, a plurality of types of photoelectric conversion devices 602 may be used in combination. The arrangement position of the photoelectric conversion device 602 is not limited to that illustrated in FIG. 22A. A display device (not illustrated) including a light emitting device such as an OLED or an LED may be provided on the rear surface side of the lens 601.

The control device 603 functions as a power supply for supplying power to the photoelectric conversion device 602 and the display device. The control device 603 has a function of controlling the operations of the photoelectric conversion device 602 and the display device. The lens 601 is provided with an optical system for focusing light on the photoelectric conversion device 602.

FIG. 22B illustrates eyeglasses 610 (smartglasses) according to another application example. The eyeglasses 610 include lenses 611 and a control device 612. A photoelectric conversion device corresponding to the photoelectric conversion device 602 and a display device (not illustrated) may be mounted on the control device 612.

The lens 611 is provided with a photoelectric conversion device in the control device 612 and an optical system for projecting light from the display device, and an image is projected thereon. The control device 612 functions as a power supply for supplying power to the photoelectric conversion device and the display device, and has a function of controlling the operations of the photoelectric conversion device and the display device.

The control device 612 may further include a line-of-sight detection unit that detects the line of sight of the wearer. In this case, an infrared light emitting unit is provided in the control device 612, and infrared light emitted from the infrared light emitting unit may be used for detection of a line of sight. Specifically, the infrared light emitting unit emits infrared light to the eyeball of the user who is watching the display image. The reflected light of the emitted infrared light from the eyeball is detected by the imaging unit having the light receiving element, whereby a captured image of the eyeball is obtained. By providing a reduction unit that reduces light from the infrared light emitting unit to the display unit in a plan view, a decrease in image quality may be reduced.

The line of sight of the user with respect to the display image may be detected from the captured image of the eyeball obtained by capturing the infrared light. Any known method may be applied to the line-of-sight detection using the captured image of the eyeball. As an example, a line-of-sight detection method based on a Purkinje image caused by reflection of irradiation light on the cornea may be used. More specifically, a line-of-sight detection processing based on the pupil cornea reflection method is performed. By using the pupil cornea reflection method, a line-of-sight vector representing the direction (rotation angle) of the eyeball is calculated based on the image of the pupil image and the Purkinje image included in the captured image of the eyeball, whereby the line-of-sight of the user is detected.

The display device according to the present embodiment may include a photoelectric conversion device having a light receiving element, and may be configured to control a display image based on line-of-sight information of a user from the photoelectric conversion device. Specifically, the display device determines a first viewing area to be gazed by the user and a second viewing area other than the first viewing area based on the line-of-sight information. The first viewing area and the second viewing area may be determined by a control device of the display device, or may be determined by an external control device. When an external control device determines, the determination result is transmitted to the display device via communication. In the display region of the display device, the display resolution of the first viewing area may be controlled to be higher than the display resolution of the second viewing area. That is, the resolution of the second viewing area may be lower than the resolution of the first viewing area.

Further, the display area may have a first display area and a second display area different from the first display area, and may be configured to determine an area having a high priority from the first display area and the second display area based on the line-of-sight information. The first display area and the second display area may be determined by a control device of the display device, or may be determined by an external control device. When an external control device determines, the determination result is transmitted to the display device via communication. The resolution of the area with high priority may be controlled to be higher than the resolution of the area other than the area with high priority. That is, the resolution of the area having a relatively low priority may be reduced.

An AI (Artificial Intelligence) may be used to determine the first viewing area or the area with high priority. The AI may be a model configured to estimate an angle of a line of sight and a distance to a target object ahead of the line of sight from an image of an eyeball, using an image of the eyeball and a direction in which the eyeball of the image is actually viewed as teacher data. The AI program may be held by the display device, the photoelectric conversion device, or an external device. When the external device has, the information is transmitted to the display device via communication.

When the display control is performed based on the visual recognition detection, the present invention may be preferably applied to smartglasses which further include a photoelectric conversion device for capturing an image of the outside. The smartglasses may display captured external information in real time.

Modified Embodiments

The present invention is not limited to the above embodiment, and various modifications are possible.

For example, an example in which some of the configurations of any of the embodiments are added to other embodiments or an example in which some of the configurations of any of the embodiments are substituted with some of the configurations of the other embodiments is also an embodiment of the present invention.

Further, in the above embodiment, the sub-counters 32 and 34 are configured by 4-bit counters, but the number of bits of the counters constituting the sub-counters 32 and 34 is not limited to 4 bits. The number of bits of the sub-counters 32 and 34 is not necessarily the same. For example, the sub-counter 32 may be configured by an M-bit counter, and the sub-counter 34 may be configured by an N-bit counter. In this case, the pulse counting unit 30 operates as a counter of (M+N) bits in the first counter connection mode.

The circuit configuration of the pixel 12 is not limited to the above embodiment. For example, a switch such as a transistor may be provided between the photoelectric conversion element PD and the quenching element 22 or between the photoelectric conversion element PD and the waveform shaping unit 24 to control an electrical connection state therebetween. Further, a switch such as a transistor may be provided between the node to which the voltage VDD is supplied and the quenching element 22 and/or between the node to which the voltage VSS is supplied and the photoelectric conversion element PD to control an electrical connection state therebetween.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-003751, filed Jan. 13, 2022, which is hereby incorporated by reference herein in its entirety.

What is claimed is:

1. A photoelectric conversion device comprising:
a pixel including a photoelectric conversion unit configured to output a pulse in response to incidence of a photon, and a pulse counting unit configured to count pulses output from the photoelectric conversion unit,
wherein the pulse counting unit includes a first counter, a second counter, a selection circuit configured to select a signal input to each of the first counter and the second counter, and a control unit configured to control the selection circuit,
wherein the control unit is configured to control the selection circuit to perform a first connection mode in which a counter of a first number of bits is configured by the first counter and the second counter, and a second connection mode in which a counter of a second number of bits smaller than the first number of bits is configured by at least one of the first counter and the second counter, and
wherein the second connection mode includes a third connection mode in which the pulses are counted in parallel by the first counter and the second counter.

2. The photoelectric conversion device according to claim 1, wherein the second connection mode further includes a fourth connection mode in which the pulse is counted by the first counter and the pulse is not counted by the second counter.

3. The photoelectric conversion device according to claim 2, wherein, in the fourth connection mode, while the first counter counts the pulses, the second counter holds a count value so far.

4. The photoelectric conversion device according to claim 3,
wherein in a first frame, the second counter counts the pulses, and
wherein in a second frame next to the first frame, the first counter counts the pulses, and the second counter holds a count value in the first frame.

5. The photoelectric conversion device according to claim 4,
wherein the pixel further includes a signal processing unit configured to process a signal output from the pulse counting unit, and
wherein the pulse counting unit simultaneously outputs the count value in the first frame held by the second counter and a count value in the second frame held by the first counter to the signal processing unit.

6. The photoelectric conversion device according to claim 2, wherein the third connection mode and the fourth connection mode are performed during one frame.

7. The photoelectric conversion device according to claim 1,
wherein the first counter is an M-bit counter, and the second counter is an N-bit counter,
wherein the first number of bits is (M+N) bits, and
wherein the second number of bits is M bits or N bits.

8. The photoelectric conversion device according to claim 1, wherein the pixel further includes a signal processing unit configured to process a signal output from the pulse counting unit.

9. The photoelectric conversion device according to claim 8, wherein the signal processing unit performs arithmetic processing between a count value of the first counter and a count value of the second counter.

10. The photoelectric conversion device according to claim 1, wherein the control unit is configured to control a connection mode of the selection circuit based on a signal received from an outside of the photoelectric conversion device.

11. The photoelectric conversion device according to claim 1, wherein
the pixel further includes a pixel level determination unit configured to determine a level of an output signal of the pulse counting unit, and
wherein the control unit is configured to control a connection mode of the selection circuit based on a signal received from the pixel level determination unit.

12. The photoelectric conversion device according to claim 11,
wherein the pixel level determination unit is configured to determine whether or not a level of the output signal of the pulse counting unit is equal to or greater than a predetermined value, and
wherein the control unit is configured to set the selection circuit to the first connection mode when the output signal is equal to or greater than the predetermined value, and sets the selection circuit to the second connection mode when the output signal is less than the predetermined value.

13. The photoelectric conversion device according to claim 12, wherein the control unit is configured to switch the selection circuit to the first connection mode when the selection circuit is operating in the second connection mode and a state in which a level of the output signal of the pulse counting unit is equal to or greater than the predetermined value continues for a predetermined number of frames.

14. The photoelectric conversion device according to claim 12, wherein the control unit is configured to switch the selection circuit to the second connection mode when the selection circuit is operating in the first connection mode and a state in which a level of the output signal of the pulse counting unit is lower than the predetermined value continues for a predetermined number of frames.

15. The photoelectric conversion device according to claim 1, wherein the pixel comprises a plurality of pixels arranged to form a plurality of rows and a plurality of columns.

16. The photoelectric conversion device according to claim 1, wherein the photoelectric conversion unit includes an avalanche photodiode that photoelectrically converts incident light and multiplies generated charge by avalanche multiplication, a quenching element that suppresses avalanche multiplication of the avalanche photodiode, and a waveform shaping unit that converts an output signal of the avalanche photodiode into a pulse.

17. A photoelectric conversion device according to claim 16 comprising:
   a first substrate provided with the avalanche photodiode; and
   a second substrate provided with the pulse counting unit.

18. A photodetection system comprising:
   the photoelectric conversion device according to claim 1; and
   a signal processing device configured to process a signal output from the photoelectric conversion device.

19. The photodetection system according to claim 18, wherein the signal processing device is configured to generate a distance image representing distance information to an object based on the signal.

20. A movable object comprising:
   the photoelectric conversion device according to claim 1;
   a distance information acquisition unit configured to acquire distance information to an object from a parallax image based on a signal output from the photoelectric conversion device; and
   a control unit configured to control the movable object based on the distance information.

* * * * *